(12) United States Patent
Kledzik et al.

(10) Patent No.: US 7,405,471 B2
(45) Date of Patent: Jul. 29, 2008

(54) CARRIER-BASED ELECTRONIC MODULE

(75) Inventors: Kenneth J. Kledzik, San Clemente, CA (US); Jason C. Engle, San Clemente, CA (US)

(73) Assignee: Legacy Electronics, Inc., San Clemente, CA (US)

( * ) Notice: Subject to any disclaimer, the term of this patent is extended or adjusted under 35 U.S.C. 154(b) by 0 days.

(21) Appl. No.: 10/648,029

(22) Filed: Aug. 26, 2003

(65) Prior Publication Data

US 2004/0108590 A1   Jun. 10, 2004

Related U.S. Application Data

(63) Continuation of application No. 09/688,500, filed on Oct. 16, 2000, now Pat. No. 6,713,854.

(51) Int. Cl.
   *H01L 23/02* (2006.01)
(52) U.S. Cl. ..................................... 257/686
(58) Field of Classification Search ................ 257/686, 257/777, 734–738, E23.499
   See application file for complete search history.

(56) References Cited

U.S. PATENT DOCUMENTS

| | | | |
|---|---|---|---|
| 3,239,719 A | 3/1966 | Shower | |
| 3,665,256 A | 5/1972 | Goun et al. | |
| 3,737,986 A | 6/1973 | Cranston | |
| 3,777,221 A | 12/1973 | Tatusko et al. | |
| 4,038,488 A | 7/1977 | Lin | |
| 4,245,877 A | 1/1981 | Auriana | |
| 4,288,841 A | 9/1981 | Gogal | |
| 4,322,778 A | 3/1982 | Barbour et al. | |
| 4,398,235 A | 8/1983 | Lutz et al. | |
| 4,437,235 A | 3/1984 | McIver | |
| 4,549,200 A | 10/1985 | Ecker et al. | |

(Continued)

FOREIGN PATENT DOCUMENTS

DE   198 45 316 A1   2/1999

(Continued)

OTHER PUBLICATIONS

"Alterable Interposer Block for Personalizing Stacked Module Interconnections", 30(8) *IBM Tech. Disclosure Bulletin* 373-4 (1988).

*Primary Examiner*—Nathan W Ha
(74) *Attorney, Agent, or Firm*—Dewey & LeBoeuf LLP; Jeff E. Schwartz

(57) ABSTRACT

An improved multi-chip module includes a circuit board having an array of electrical interconnection pads to which are mounted a plurality of IC package units. Each IC package unit includes multiple IC packages, which are mounted on opposite sides of a package carrier. The package units may be mounted on one or both sides of the circuit board. A variety of package carriers are used to create a number of different modules. One type of package carrier has a pair of major planar surfaces. Each planar surface incorporates electrical contact pads. At least one IC package is surface mounted on each major planar surface, by interconnecting the connection elements, or leads, of the package with the contact pads on the planar surface, to form the IC package unit. Another type of package carrier substrate has a multiple recesses for back-to-back surface mounting of the IC packages. The package also includes in various versions heat sinks.

29 Claims, 15 Drawing Sheets

U.S. PATENT DOCUMENTS

| | | |
|---|---|---|
| 4,616,655 A | 10/1986 | Weinberg et al. |
| 4,632,293 A | 12/1986 | Feinstein |
| 4,763,188 A | 8/1988 | Johnson |
| 4,802,062 A | 1/1989 | Blum et al. |
| 4,982,265 A | 1/1991 | Watanabe et al. |
| 5,061,990 A * | 10/1991 | Arakawa et al. ............ 257/676 |
| 5,107,586 A | 4/1992 | Eichelberger et al. |
| 5,128,831 A | 7/1992 | Fox, III et al. |
| 5,130,894 A | 7/1992 | Miller |
| 5,191,404 A | 3/1993 | Wu et al. |
| 5,239,198 A | 8/1993 | Lin et al. |
| 5,239,447 A | 8/1993 | Cotues et al. |
| 5,241,456 A | 8/1993 | Marcinkiewicz et al. |
| 5,262,594 A | 11/1993 | Edwin et al. |
| 5,285,352 A | 2/1994 | Pastore et al. |
| 5,311,401 A | 5/1994 | Gates, Jr. et al. |
| 5,311,407 A | 5/1994 | Lumbard |
| 5,313,366 A | 5/1994 | Gaudenzi et al. |
| 5,316,787 A | 5/1994 | Frankeny et al. |
| 5,377,077 A | 12/1994 | Burns |
| 5,400,904 A | 3/1995 | Maston, III et al. |
| 5,418,688 A | 5/1995 | Hertz et al. |
| 5,450,283 A | 9/1995 | Lin et al. |
| 5,479,318 A | 12/1995 | Burns |
| 5,492,223 A | 2/1996 | Boardman et al. |
| 5,498,906 A | 3/1996 | Roane et al. |
| 5,514,907 A | 5/1996 | Moshayedi |
| 5,570,274 A | 10/1996 | Saito et al. |
| 5,579,207 A | 11/1996 | Hayden et al. |
| 5,656,856 A | 8/1997 | Kweon |
| 5,677,569 A | 10/1997 | Choi et al. |
| 5,701,233 A | 12/1997 | Carson et al. |
| 5,739,581 A | 4/1998 | Chillara et al. |
| 5,742,097 A | 4/1998 | Matsunage et al. |
| 5,744,827 A | 4/1998 | Jeong et al. |
| 5,744,862 A * | 4/1998 | Ishii ............................ 257/693 |
| 5,754,408 A * | 5/1998 | Derouiche .................. 361/773 |
| 5,757,079 A | 5/1998 | McAllister et al. |
| 5,783,870 A | 7/1998 | Mostafazadeh et al. |
| 5,790,378 A | 8/1998 | Chillara |
| 5,810,609 A | 9/1998 | Faraci et al. |
| 5,869,353 A | 2/1999 | Levy et al. |
| 5,869,356 A | 2/1999 | Fuller, Jr. et al. |
| 5,910,885 A | 6/1999 | Gulachenski et al. |
| 6,014,316 A | 1/2000 | Eide |
| 6,028,352 A | 2/2000 | Eide |
| 6,049,972 A | 4/2000 | Link et al. |
| 6,069,025 A * | 5/2000 | Kim ............................ 438/109 |
| 6,072,122 A | 6/2000 | Hosoya |
| 6,081,429 A | 6/2000 | Barrett |
| 6,084,293 A | 7/2000 | Ohuchi |
| 6,084,780 A | 7/2000 | Happoya |
| 6,093,249 A | 7/2000 | Curtin |
| 6,101,100 A | 8/2000 | Londa |
| 6,107,683 A | 8/2000 | Castro et al. |
| RE36,916 E | 10/2000 | Moshayedi |
| 6,133,626 A | 10/2000 | Hawke et al. |
| 6,160,718 A * | 12/2000 | Vakilian ..................... 361/803 |
| 6,214,640 B1 | 4/2001 | Fosberry et al. |
| 6,222,739 B1 * | 4/2001 | Bhakta et al. ............... 361/790 |
| 6,262,488 B1 | 7/2001 | Masayuki et al. |
| 6,291,259 B1 | 9/2001 | Chun |
| 6,313,522 B1 | 11/2001 | Akram et al. |
| 6,313,524 B1 | 11/2001 | Pueschner et al. |
| 6,313,998 B1 * | 11/2001 | Kledzik et al. .............. 361/767 |
| 6,320,757 B1 | 11/2001 | Liu |
| 6,363,846 B1 | 4/2002 | Murakami |
| 6,388,335 B1 | 5/2002 | Lam |
| 6,404,043 B1 | 6/2002 | Isaak |
| 6,428,650 B1 | 8/2002 | Chung |
| 6,445,591 B1 | 9/2002 | Kwong |
| 6,462,284 B1 | 10/2002 | Hashimoto |
| 6,469,376 B2 | 10/2002 | Vaiyapuri |
| 6,472,735 B2 | 10/2002 | Isaak |
| 6,559,539 B2 | 5/2003 | Tu et al. |
| 6,566,746 B2 | 5/2003 | Isaak et al. |
| 6,566,760 B1 * | 5/2003 | Kawamura et al. .......... 257/777 |
| 6,614,110 B1 | 9/2003 | Pace |
| 6,618,267 B1 | 9/2003 | Dalal et al. |
| 6,627,984 B2 | 9/2003 | Bruce et al. |
| 6,628,527 B2 | 9/2003 | Muramatsu et al. |
| 6,665,194 B1 | 12/2003 | Patel et al. |
| 6,683,377 B1 * | 1/2004 | Shim et al. .................. 257/723 |
| 6,777,798 B2 | 8/2004 | Fukumoto et al. |
| 6,828,666 B1 * | 12/2004 | Herrell et al. ............... 257/691 |
| 6,924,556 B2 | 8/2005 | Cha |
| 7,045,901 B2 | 5/2006 | Lin et al. |
| 2002/0088355 A1 | 7/2002 | Comulada |
| 2003/0122240 A1 * | 7/2003 | Lin et al. .................... 257/686 |
| 2003/0137808 A1 * | 7/2003 | Kledzik et al. .............. 361/704 |
| 2003/0168725 A1 * | 9/2003 | Warner et al. ............... 257/686 |
| 2003/0201525 A1 * | 10/2003 | James et al. ................ 257/686 |
| 2003/0201526 A1 * | 10/2003 | Bolken et al. ............... 257/686 |

FOREIGN PATENT DOCUMENTS

| | | |
|---|---|---|
| DE | 100 29 259 A1 | 12/2001 |
| EP | 0 714 231 A2 | 5/1996 |
| JP | 08-051183 | 2/1996 |
| JP | 09-245926 | 9/1997 |
| JP | 10-074769 | 3/1998 |
| JP | 11-111914 | 4/1999 |
| JP | 2000-031617 | 2/2000 |
| JP | 2003-521806 A | 7/2003 |
| WO | WO 00/65652 A1 | 11/2000 |
| WO | WO 00/68996 A1 | 11/2000 |
| WO | WO 01/48819 A2 | 7/2001 |
| WO | WO 01/69680 A2 | 9/2001 |

* cited by examiner

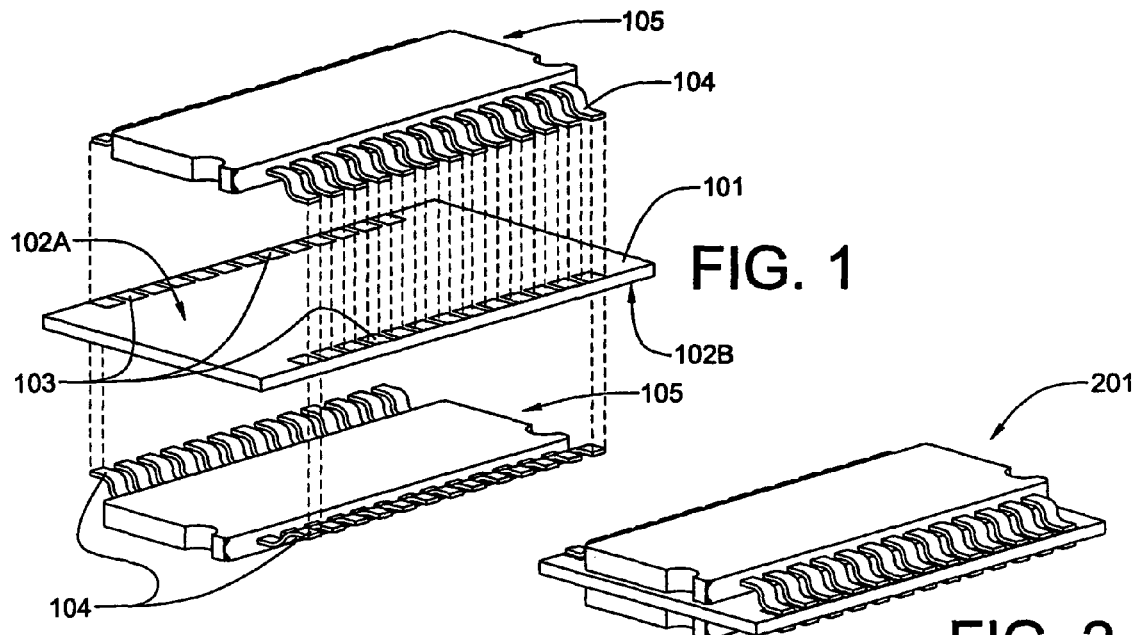
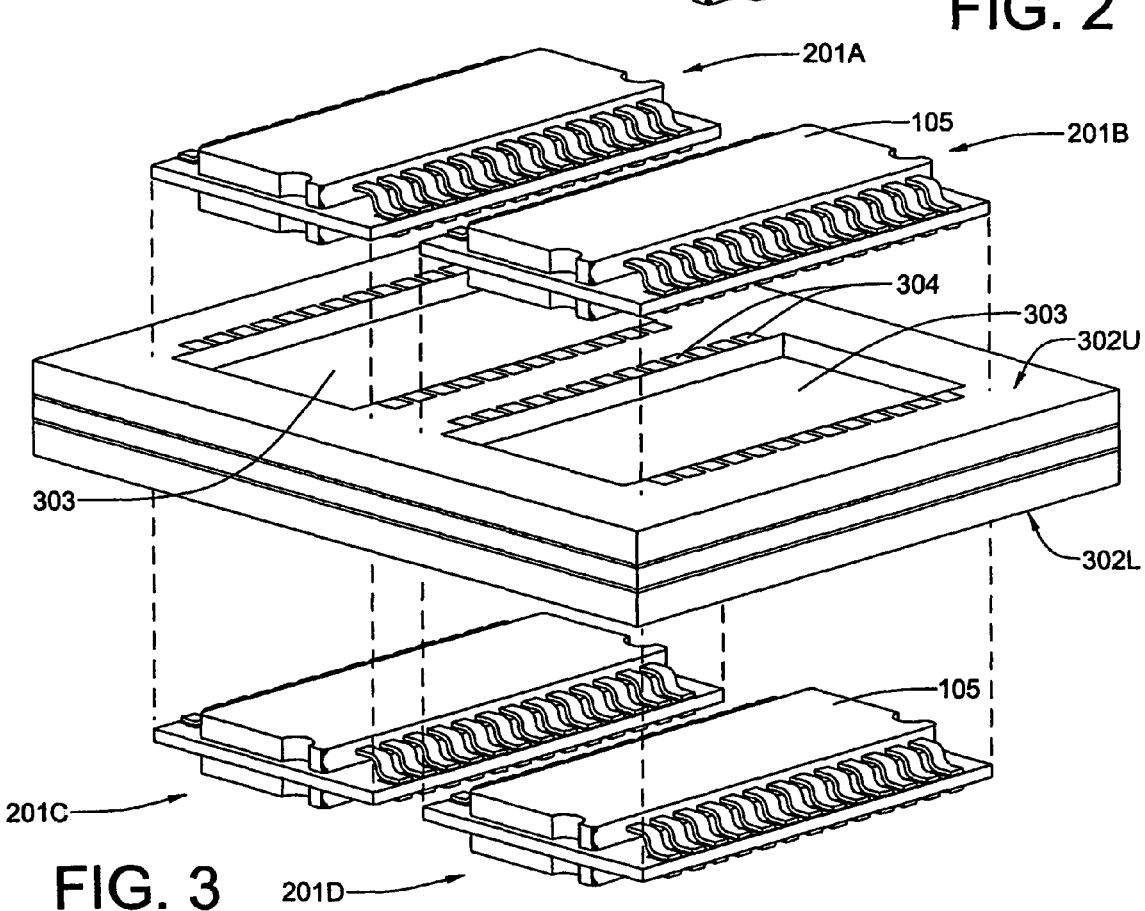

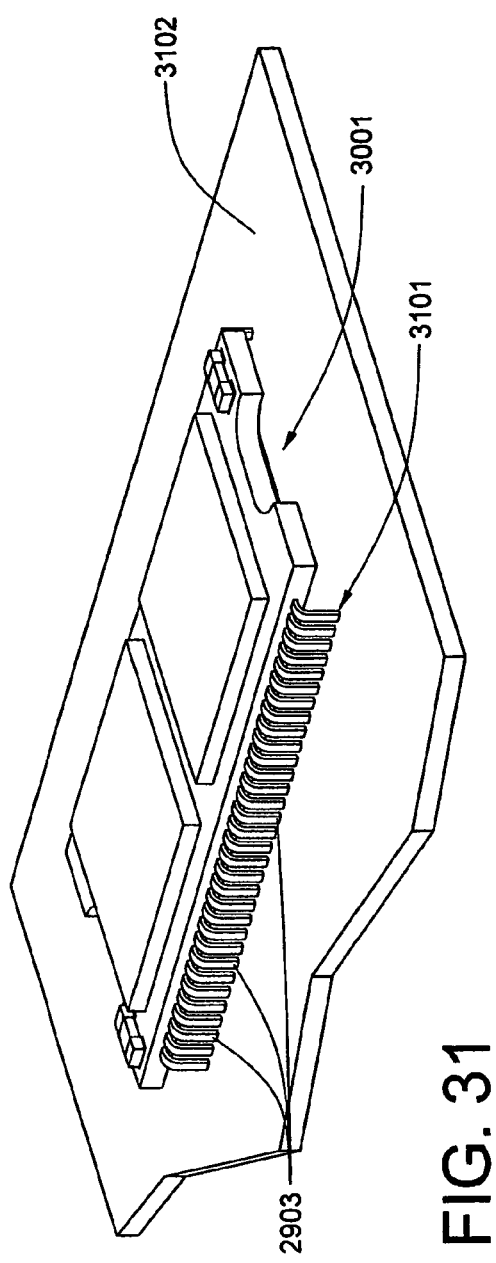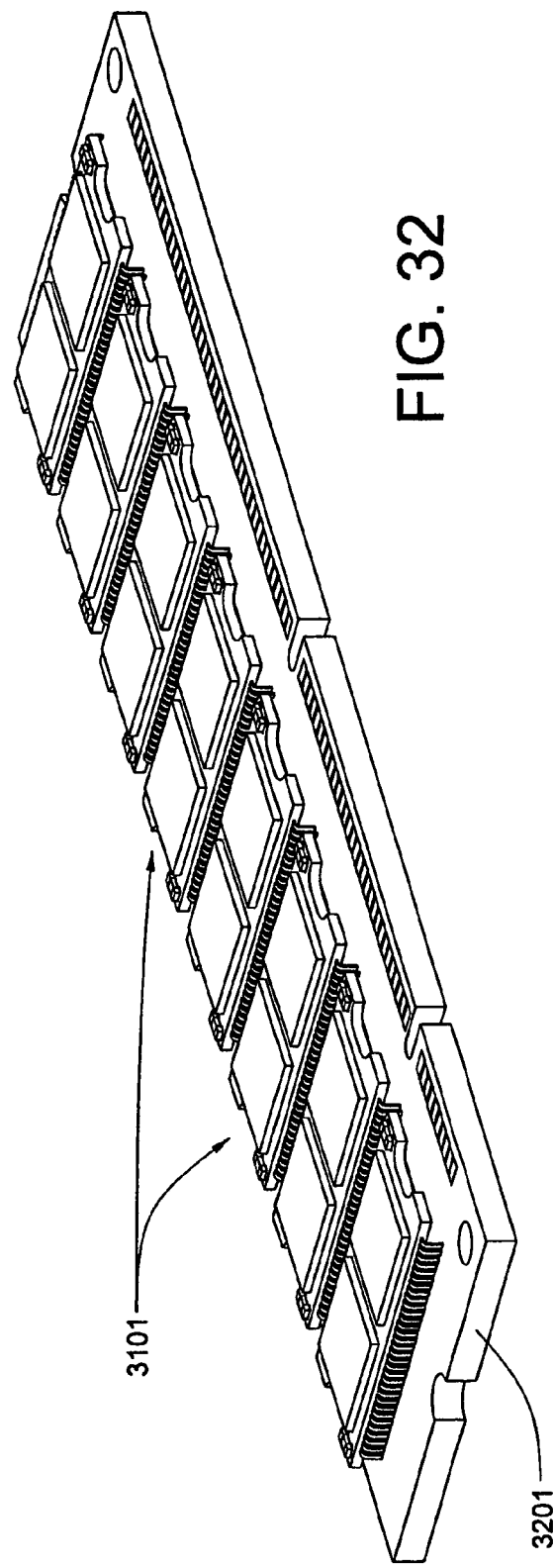

CARRIER-BASED ELECTRONIC MODULE

This is a continuation of application Ser. No. 09/688,500 filed on Oct. 16, 2000 now U.S. Pat. No. 6,713,854.

This invention is related to two U.S. patent applications, the first of which is application Ser. No. 09/285,354, which was filed on Apr. 2, 1999, and which is titled ELECTRONIC MODULE HAVING A THREE DIMENSIONAL ARRAY OF INTEGRATED CIRCUIT PACKAGES, the second of which is application Ser. No. 09/524,324, which was filed on Mar. 13, 2000, and which is titled ELECTRONIC MODULE HAVING A THREE DIMENSIONAL ARRAY OF INTEGRATED CIRCUIT PACKAGES.

FIELD OF THE INVENTION

This invention relates to the production of multi-chip electronic modules, and more particularly to a method and apparatus for attaching multiple integrated circuit packages to printed circuit boards. It also relates to high-density memory modules having three-dimensional arrangements of integrated circuit packages.

BACKGROUND OF THE INVENTION

Demand for semiconductor memory is highly elastic. When such memory is relatively inexpensive compared to the overall cost of a computer system, an almost unsatiable demand results, with computer manufacturers tending to install an amount of main memory in each system that greatly exceeds the amount required for average program use. On the other hand, when it is costly, manufacturers typically install an amount in each system that only marginally fulfills the requirement of the average program. Although the sales prices of computers may, thus, be maintained at low levels, the end user may soon find that he must upgrade his computer's main memory.

The ever increasing demand for large random access computer memories, and the growing demand for increasingly compact computers, coupled with an incentive on the part of the semiconductor manufacturers to reduce the cost per bit, has lead to not only a quadrupling of circuit density approximately every three years, but to increasingly efficient techniques for packaging and mounting the circuit chips. Up until the late 1980's, semiconductor memory chips were usually packaged as dual in-line pin packages (DIPPs). The pins of these DIPP packages were generally soldered directly within through-holes in a circuit board (e.g., the motherboard), or they were inserted in sockets which were, in turn, soldered within through-holes in the circuit board. With the advent of surface mount technology, conventional plated through-holes on printed circuit boards have been replace with conductive mounting pads. Small Outline J-lead (SOJ) packages have led to Thin Small Outline Packages (TSOPs). Because the pitch or spacing between centers of adjacent surface mount pins is significantly less than the conventional 0.10-inch spacing for conventional through-hole components, surface mount chips tend to be considerably smaller than corresponding conventional chips, thus taking up less space on a printed circuit board. Additionally, as through holes are no longer needed, surface mount technology lends itself to the mounting of components on both sides of a printed circuit board. Memory modules utilizing surface-mount packages on both sides have become the standard. Both the earlier single in-line memory modules (SIMMs) and the currently used dual in-line memory modules (DIMMs) are inserted into sockets on the motherboard.

Packaging density may be increased rather dramatically by fabricating modules in which a plurality of integrated circuit (IC) chips, such as memory chips, are stacked in a three dimensional arrangement. As a general rule, the three-dimensional stacking of chips requires complex, non-standard packaging methods.

One example of a vertical stack of IC chips is provided by U.S. Pat. No. 4,956,694 to Floyd Eide, titled INTEGRATED CIRCUIT CHIP STACKING. A plurality of integrated circuits are packaged within chip carriers and stacked, one on top of the other, on a printed circuit board. Except for the chip select terminal, all other like terminals on the chips are connected in parallel.

Another example of chip stacking is given in U.S. Pat. No. 5,128,831 to Fox, et al. titled HIGH-DENSITY ELECTRONIC PACKAGE COMPRISING STACKED SUB-MODULES WHICH ARE ELECTRICALLY INTERCONNECTED BY SOLDER-FILLED VIAS. The package is assembled from individually testable sub-modules, each of which has a single chip bonded thereto. The sub-modules are interleaved with frame-like spacers. Both the sub-modules and the spacers have alignable vias which provide interconnection between the various sub-modules.

U.S. Pat. No. 5,313,096, also issued to Floyd Eide and titled IC CHIP PACKAGE HAVING CHIP ATTACHED TO AND WIRE BONDED WITHIN AN OVERLYING SUBSTRATE, is another example. Such a package includes a chip having an upper active surface bonded to the lower surface of a lower substrate layer having conductive traces on its upper surface which terminate in conductive pads on its periphery. Connection between terminals on the active surface and the traces is made with wire bonds through apertures within the lower substrate layer. An upper substrate layer, which is bonded to the lower substrate layer, has apertures which coincide with those of the lower substrate layer and provide space in which the wire bonding may occur. After wire bonding has occurred, the apertures are filled with epoxy to form an individually testable sub-module. Multiple sub-modules can be stacked and interconnected with metal strips attached to their edges.

A final example of a stacked-chip module is disclosed in U.S. Pat. No. 5,869,353 to A. U. Levy, et al. titled MODULAR PANEL STACKING PROCESS. A plurality of panels are fabricated having apertures therein, an array of chip-mounting pads at the bottom of the apertures, and interfacing conductive pads. Both the chip-mounting pads and the interfacing conductive pads are coated with solder paste. Plastic-encapsulated surface-mount IC chips are positioned on the paste-covered mounting pads, multiple panels are stacked in a layered arrangement and the stack is heated to solder the chip leads to the mounting pads and the interfacing pads of adjacent panels together. Individual chip package stacks are then separated from the panel stack by a cutting and cleaving operation.

As can be seen by the foregoing examples, increased chip density is achieved through the use of complicated packaging and stacking arrangements, which must necessarily be reflected in a higher costs per bit of storage.

SUMMARY OF THE INVENTION

The present invention provides for an improved multi-chip module having increased chip density. All embodiments of the improved module include a circuit board having an array of electrical interconnection pads to which are mounted a plurality of IC package units. Each IC package unit includes multiple IC packages, which are mounted on both opposing sides of a package carrier. The package units may be mounted on one or both sides of the circuit board.

A first embodiment of the invention employs a laminar package carrier having a pair of major planar surfaces. Each planar surface incorporates electrical contact pads. At least one IC package is surface mounted on each major planar surface, by interconnecting the connection elements of the package with the contact pads on the planar surface, to form the IC package unit. Each unit is mounted within its own recess in the circuit board, with one IC package being right-side up, and the other being upside-down. The upside-down IC package may be in contact with a heat sink layer embedded within the circuit board. If corresponding contact pads on both sides of the package carrier are interconnected within the carrier body, contact may be made between the connection elements, or leads, of the IC package closest to the circuit board and the interconnection pads thereon. Using this interconnection technique, the chip carrier may be either a rigid or semi-rigid laminar substrate or it may be a thin film carrier. For another variation of this first embodiment, the laminar substrate package carrier may be modified to incorporate its own set of interconnection leads which mate with the interconnection pads on the circuit board. Greater flexibility is provided by this technique, as rerouting of lead positions may take place within the carrier body. In addition, if connection elements on one IC package must be connected independently with respect to corresponding connection elements on the other package of the package pair (e.g., chip select leads), additional carrier leads may be provided to accomplish the independent connections.

A second embodiment of the invention utilizes a carrier substrate which has at least one recess on each opposing surface for back-to-back surface mounting of the IC packages. IC packages mounted on opposite sides of the carrier may be in contact with opposite sides of a heat sink layer embedded within the carrier substrate. Each resulting IC package unit is surface mounted to the circuit board. If the leads of both packages are interconnected on the carrier, then connection to the circuit board may be made by attaching the leads of only one package directly to the circuit board. However, like the first embodiment, the package carrier may be equipped with its own leads which are connected to the various leads of the mounted IC packages. In such a case, the package carrier leads are directly connected to the interconnection pads on the circuit board.

Third and fourth embodiments of the invention utilize a third embodiment IC package unit having carriers which incorporate features of both the first and second embodiments. One of the packages is mounted on a planar surface of the carrier right-side up, while the other package is mounted on the carrier in a recess upside down. Two different embodiments of modules result because the carrier may be mounted on two types of circuit boards. Either the IC package that is mounted on the planar surface of the carrier, or the IC package that is mounted within the recess, may be mounted adjacent to the circuit board. In the former case, the adjacent package of the package unit fits within a recess on the circuit board. In the latter case, the adjacent package of the package unit mounts on a planar surface of the circuit board. As in the other embodiments, the carrier may be equipped with its own set of interconnection leads which interface with the interconnection pads on the circuit board. Likewise, if the leads of one package are interconnected with those of the other package on the carrier, connection to the circuit board may be made with the leads of the adjacent package.

A fifth embodiment module utilizes a fourth embodiment IC package unit. The primary difference between the fourth embodiment carrier and third embodiment carrier is the addition of carrier leads to the former, the leads being used to attach the fourth embodiment package unit to a circuit board.

A sixth embodiment module utilizes a fifth embodiment IC package unit having a flexible thin film substrate. In most other respects, this IC package unit is similar to the first embodiment IC package unit.

A seventh embodiment module utilizes a sixth embodiment IC package unit having ball-grid-array type IC packages. Because the connection elements (the pads and attached balls) are oriented face down against the surface of the carrier, this particular package unit utilizes carrier leads to make connection to the printed circuit board.

For any of the seven module embodiments, electrical connection between electrical traces on the carrier and electrical traces on the circuit board may be accomplished using one of several commonly used interconnection techniques, such as solder reflow, solder dot bridges, or ball grid joints. In the case where the carrier itself is equipped with leads, leads of the "J" or gull-wing type may be used, with the latter type being the preferred.

The invention may be utilized to increase memory density on memory modules. For other types of IC packages, it may be employed to more efficiently utilize available real estate on a printed circuit board.

DESCRIPTION OF THE DRAWINGS

FIG. 1 is an exploded isometric view of a first embodiment of an IC package unit, which has a laminar substrate carrier with two major planar surfaces, each major planar surface having an array of mounting pads to which a single IC package may be mounted;

FIG. 2 is an isometric view of the assembled package unit of FIG. 1;

FIG. 3 is an isometric view of an exploded first embodiment electronic module incorporating multiple first embodiment IC package units;

FIG. 31 is an isometric view of the assembled sixth embodiment IC package unit of FIG. 29 mounted on a portion of a printed circuit board;

FIG. 32 is an isometric view of a seventh embodiment module having 8 IC package units;

DETAILED DESCRIPTION OF THE INVENTION

Figure 4:
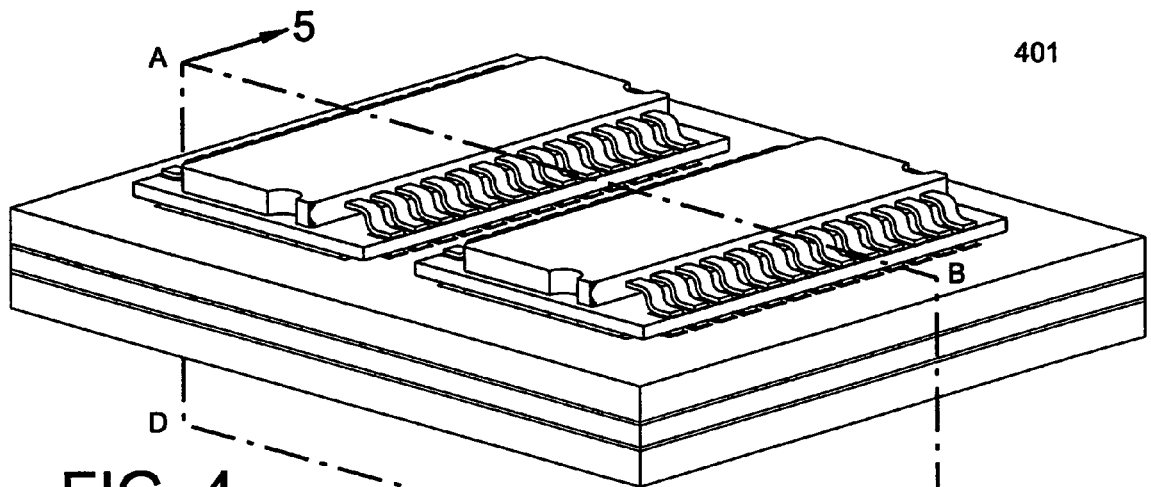
FIG. 4 is an isometric view of the assembled first embodiment electronic module of FIG. 3.
Figure 5:
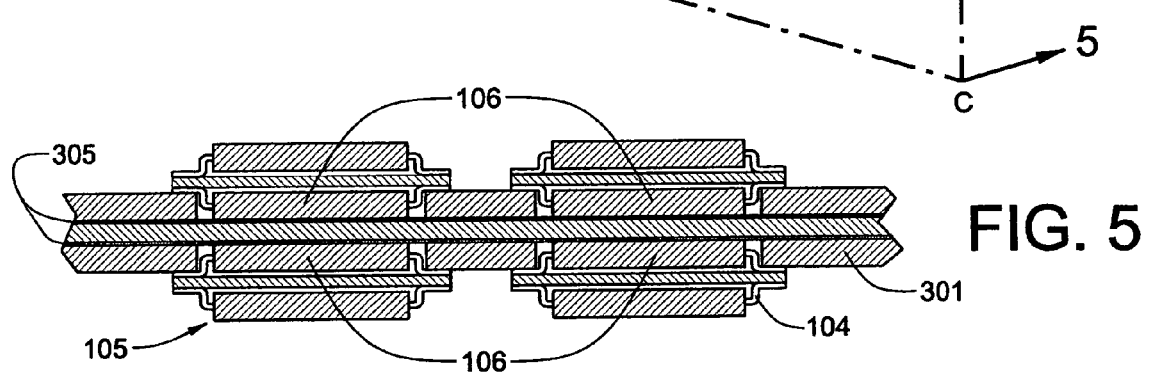
FIG. 5 is a cross-sectional view of the assembled first embodiment electronic module of FIG. 4.
Figure 6:
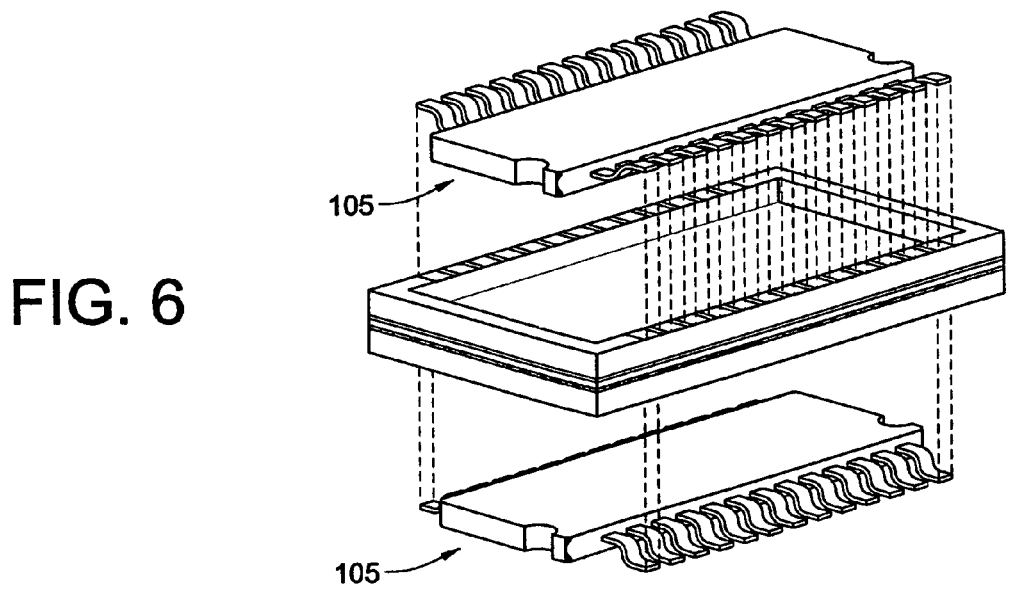
FIG. 6 is an exploded isometric view of a second embodiment of an IC package unit, which has an IC chip carrier with a pair of recesses for back-to-back surface mounting of the IC package pair.
Figure 7:
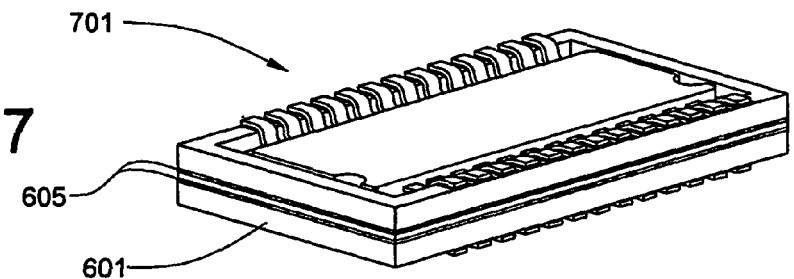
FIG. 7 is an isometric view of the assembled package unit of FIG. 6.

The present invention provides for an improved multi-chip module having increased chip density over conventional modules presently in use. All embodiments of the improved module include a circuit board having an array of electrical interconnection pads to which are mounted a plurality of IC package units. Each IC package unit includes a package carrier having multiple IC packages, which are mounted on opposite sides of the package carrier. The package units may be mounted on one or both sides of the circuit board. The connection elements (leads or pads) of each of the packages are coupled to a carrier interface, which may or may not include discrete carrier leads.

A first embodiment of the invention, shown in FIGS. 1 through 5, utilizes a laminar package carrier 101 having a pair of major planar surfaces 102A and 102B. Each major planar surface incorporates at least one set of carrier contact pads 103, each set being configured to receive, by surface mounting, the connection elements, or leads, 104 of an integrated circuit (IC) package 105 of the TSOP (Thin Small Outline Package) type. In this particular example, the leads 104 of an IC package 105 are attached to each contact pad set 103. The resulting assembly, shown in FIG. 2, constitutes a first embodiment IC package unit 201.

Referring now to FIG. 3, multiple first embodiment package units 201 (in this example, four) are shown ready for mounting on a circuit board 301. In this example, two package units 201A and 201B will be mounted on the upper surface 302U of the circuit board 301, while two package units 201C and 201D will be mounted on the lower surface 302L thereof. One IC package 105H of each package unit 201 fits within its own recess 303 in the circuit board 301 so that it is completely hidden from view, while the other IC package 105E is completely exposed. The surrounding edges of each recess are equipped with a set of board electrical connection contact pads 304. The leads of each hidden package 105H will make direct contact with the contact pads of its recess and will be routed within the circuit board 301 to the appropriate interconnection sites. The leads 104 of the exposed IC package 105E are coupled to the leads 104 of the connections which penetrate the laminar carrier 101. By using a multi-conductive-layer carrier, rerouting of the lead positions may be accomplished. For example hidden package 105H by means of, if both packages are identical memory chips requiring individual chip select signals, a chip select signal may be routed to an unused lead of the hidden IC package 105H, then routed within the carrier 101 to the proper location on the exposed IC package 105E. As all other signals may be shared in common, interconnections between leads of the hidden IC package 105H and identically corresponding leads of the exposed IC package 105E may be made by plated through-holes in the carrier 101. The circuit board 301 may incorporate one or more heat-sink layers 304 with which the bodies of hidden IC packages 104H are in surface-to-surface contact, either directly or indirectly via a thin layer of thermally-conductive paste, such as zinc oxide paste (not shown).

Referring now to FIG. 4, surface mounting of the package units 201 on the circuit board 301 has resulted in a completed first embodiment module 401. A cross sectional view through the plane ABCD 402 provides the view of FIG. 5.

A second embodiment of the invention, shown in FIGS. 6 through 10, utilizes a carrier 601 which has a pair of recesses 602 for back-to-back mounting of a pair of TSOP IC packages 105. The edges surrounding each recess 602 are equipped with an electrical contact pad set 603 to which the leads 104 of each IC package are electrically connected. The bodies 604 two IC packages 105 may be in contact with opposite sides of a heat sink layer 605 embedded within the carrier substrate. A conductive paste (not shown) may be employed to enhance heat transfer between the package body 106 and the heat sink layer 605. The resulting assembly, shown in FIG. 7, constitutes a second embodiment IC package unit 701.

Figure 8:
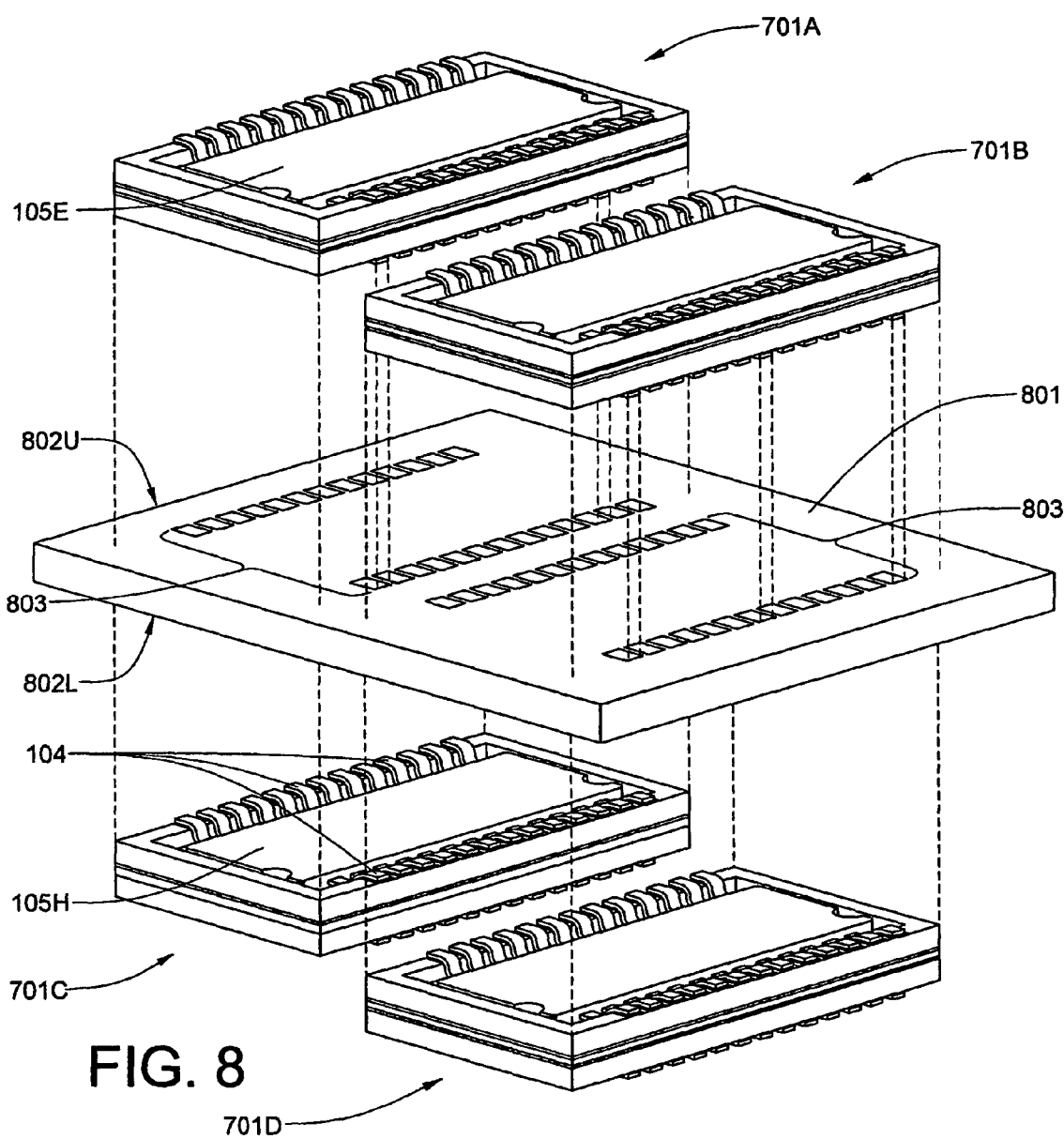
FIG. 8 is an isometric view of an exploded second embodiment electronic module incorporating multiple second embodiment IC package units.

Referring now to FIG. 8, multiple second embodiment package units 701 (in this example, four) are shown ready for mounting on a circuit board 801. In this example, two package units 701A and 701B will be mounted on the upper surface 802U of the circuit board 801, while two package units 701C and 701D will be mounted on the lower surface 802L thereof. Each package mounting location on the circuit board 801 has a set of board contact pads 803 to which the leads 104 of a hidden adjacent IC package 105H of each package unit 701 will be conductively bonded. The leads 104 of the exposed nonadjacent IC package 105E of each package unit 701 are coupled to the leads 104 of the hidden package 105H by means of connections which penetrate the 601. As is the case with the first embodiment of the invention, by using a multi-conductive-layer carrier, rerouting of the lead positions may be accomplished. For example, if both packages are identical memory chips requiring individual chip select signals, a chip select signal may be routed to an unused lead of the hidden IC package 105H, then routed within the carrier 601 to the proper location on the exposed IC package 105E. As all other signals may be shared in common, interconnections between leads of the hidden IC package 105H and identically corresponding leads of the exposed IC package 105E may be made by plated through-holes in the carrier 601.

Figure 9:
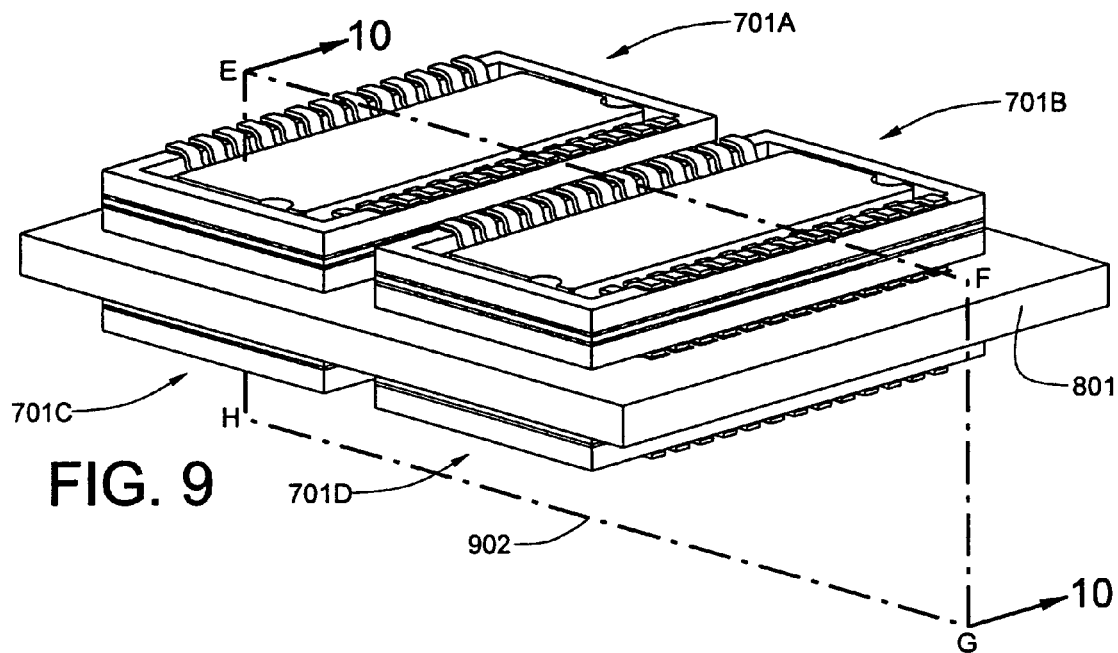
FIG. 9 is an isometric view of the assembled second embodiment electronic module of FIG. 8.
Figure 10:
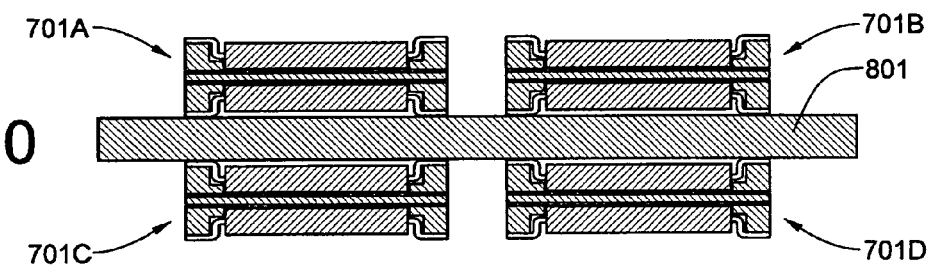
FIG. 10 is a cross-sectional view of the second embodiment assembled electronic module of FIG. 9.

Referring now to FIG. 9, surface mounting of the package units 701 on the circuit board 801 has resulted in a completed second embodiment module 901. A cross sectional view of the module 901 through the plane EFGH 902 provides the view of FIG. 10.

A third embodiment IC package unit, shown in FIGS. 11-14 is used for both third and fourth embodiment modules. The third embodiment package unit incorporates features of both the first and second embodiment package units 201 and 701, respectively. One of the pair of IC packages 105 is mounted on a planar surface of the carrier right-side up, while the other package is mounted within a recess on the opposite side of the carrier upside down. Using such a mounting configuration, both IC packages of each package unit are positioned as though stacked one on top of the other. For identical packages, interconnection of common signal lines is facilitated. Referring now to FIGS. 11-14, the third embodiment package unit utilizes a carrier 1101 which has a planar first major surface 1102 and a second major surface 1103 with a package mounting recess 1104. Both the planar surface 1102 and the recess-equipped second surface 1103 have an electrical contact pad set 1105A and 1105B, respectively, to which the leads 104 of each IC package 105 are to be electrically connected. The body of the recessed IC package 105R may be in contact with a heat sink layer 1106 embedded within the carrier substrate 1107. A conductive paste (not shown) may be employed to enhance heat transfer between the package body and the heat sink layer 1106. The resulting assembly, shown in FIGS. 12 and 14, constitutes the third embodiment IC package unit 1201.

Figure 15:
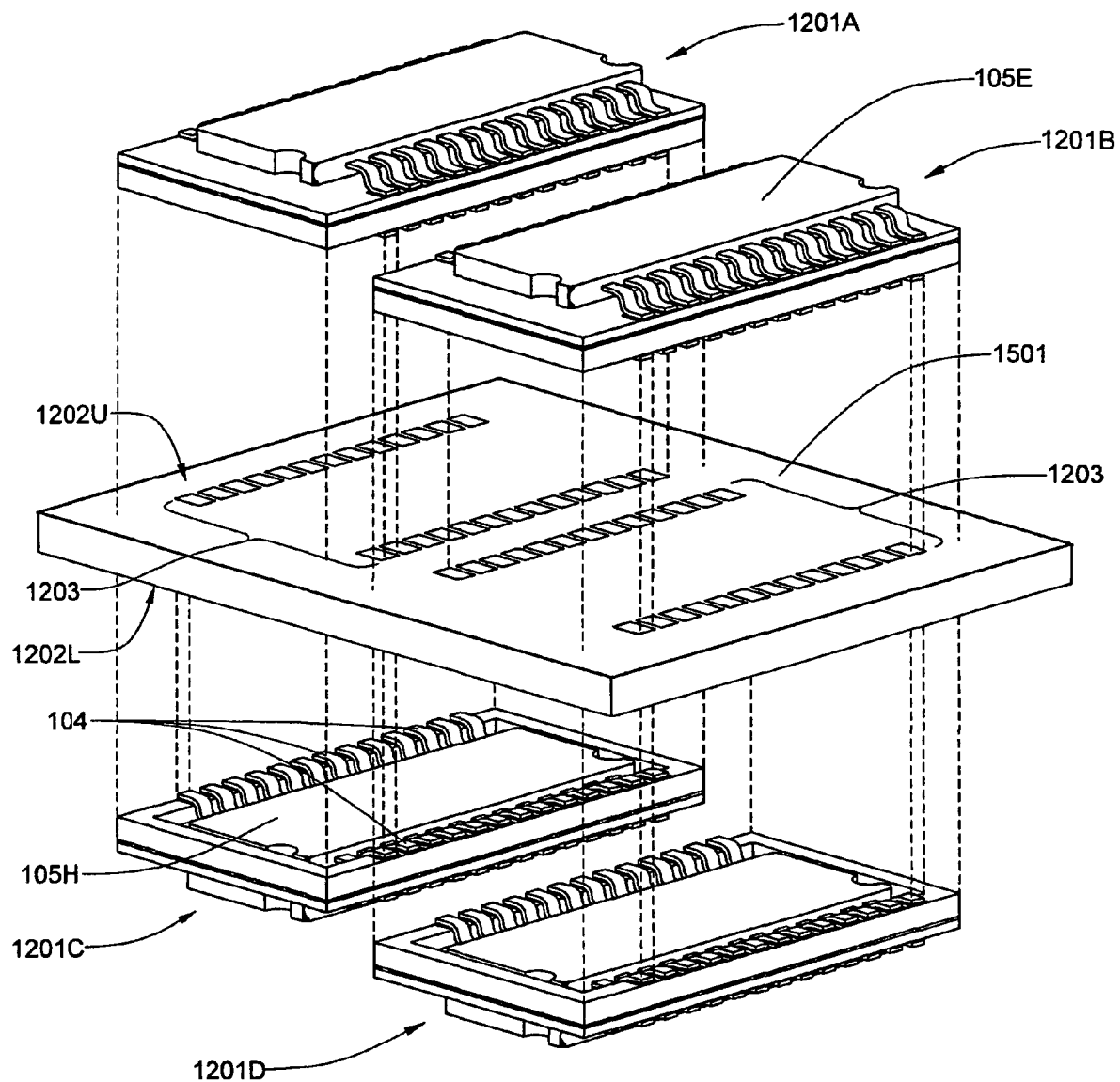
FIG. 15 is an isometric view of an exploded third embodiment electronic module incorporating multiple third embodiment IC package in combination with a circuit board having a pair of opposing major planar surfaces.

Referring now to FIG. 15, multiple third embodiment package units 1201 (in this example, four) are shown ready for mounting on a circuit board 1501 having two major opposing planar surfaces on which package units may be mounted. In this example, two package units 1201A and 1201B will be mounted on the upper surface 1502U of a circuit board 1501, while two package units 1201C and 1201D will be mounted on the lower surface 1502L thereof. Each package mounting location on the circuit board 1201 has a set of board contact pads 1203 to which the leads 104 of a hidden adjacent IC package 105H of each package unit 1201 will be conductively bonded. The leads 104 of the exposed nonadjacent IC package 105E of each package unit 1201 are coupled to the leads 104 of the hidden package 105H by means of connections which penetrate the carrier 1101. As is the case with the first and second embodiments of the invention, by using a multi-conductive-layer carrier, rerouting of the lead positions may be accomplished. For example, if both packages are identical memory chips requiring individual chip select signals, a chip select signal may be routed to an unused lead of the hidden IC package 105H, then routed within the carrier 1101 to the proper location on the exposed IC package 105E. As all other signals may be shared in common, interconnections between leads of the hidden IC package 105H and identically corresponding leads of the exposed IC package 105E may be made by plated through-holes in the carrier 1101.

Figure 19:
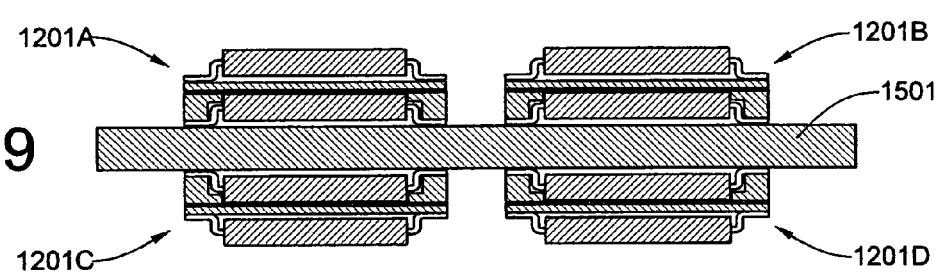
FIG. 19 is a cross-sectional view of the assembled third embodiment assembled electronic module of FIG. 16.
Figure 16:
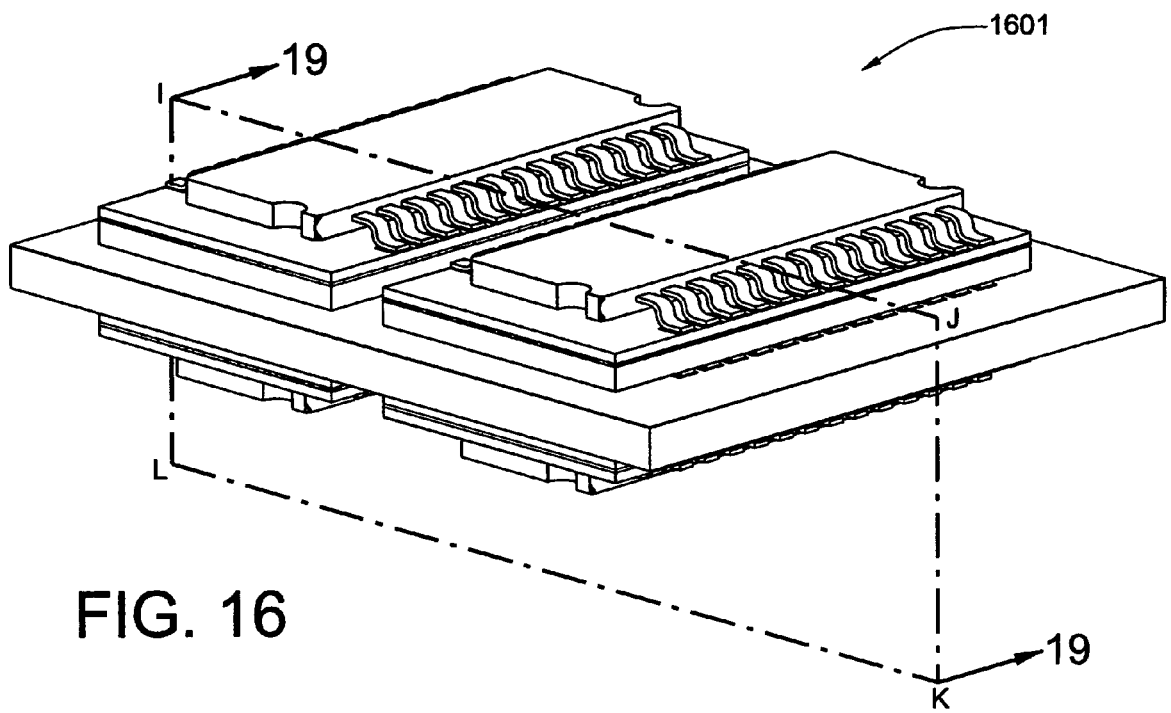
FIG. 16 is an isometric view of the assembled third embodiment electronic module of FIG. 15.

Referring now to FIG. 16, surface mounting of the package units 1201 on the circuit board 1501 has resulted in a completed third embodiment module 1601. A cross sectional view of the module 1601 through the plane IJKL 1602 provides the view of FIG. 19.

Figure 17:
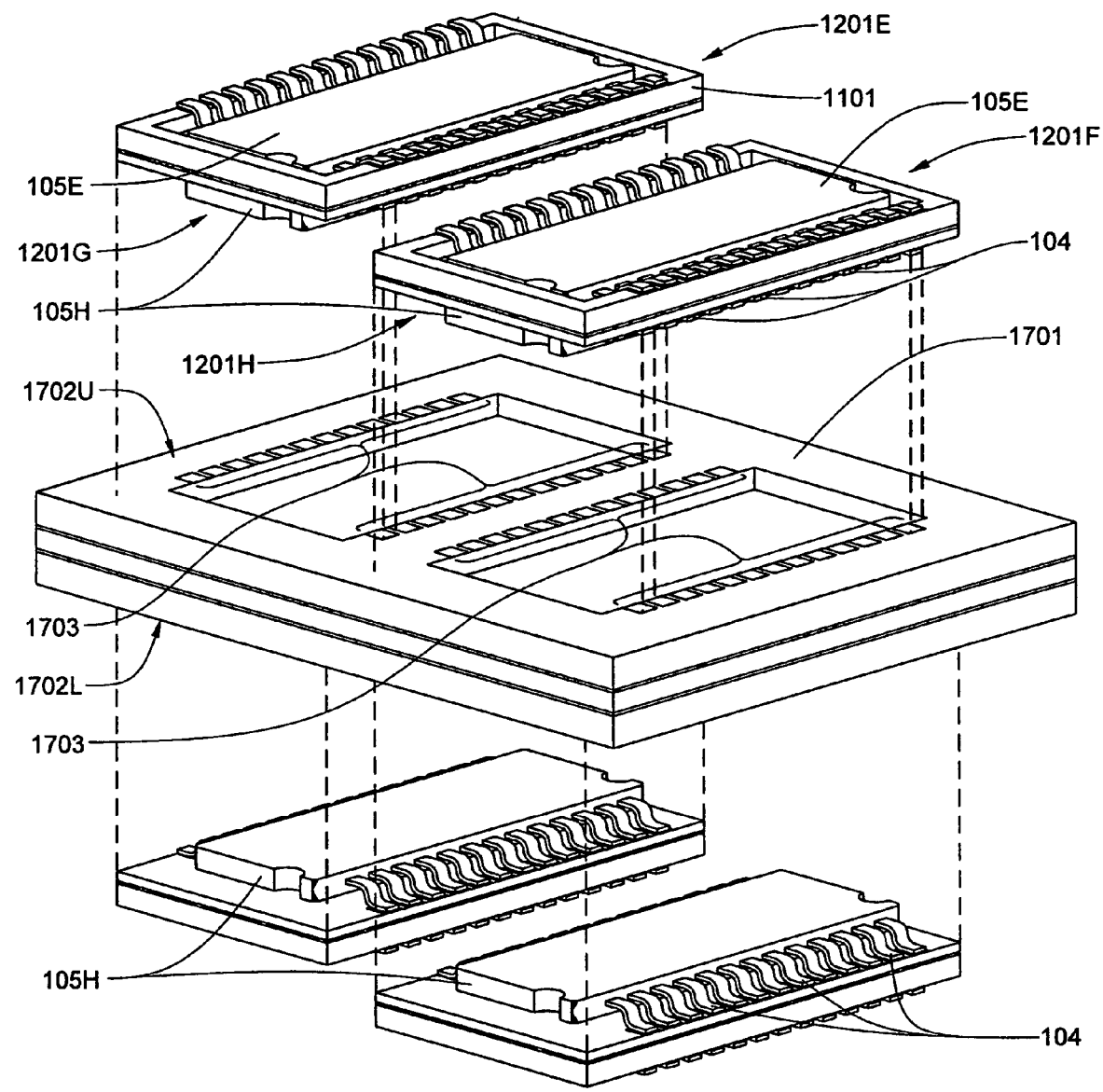
FIG. 17 is an isometric view of an exploded fourth embodiment electronic module incorporating multiple third embodiment IC package units in combination with a circuit board having a pair of opposing faces, each of which is equipped with multiple chip-receiving recesses.

Referring now to FIG. 17, multiple third embodiment package units 1201 (in this example, four) are shown ready for mounting on a circuit board 1701 having two major opposing surfaces equipped with package unit mounting recesses 1702. In this example, two package units 1201A and 1201B will be mounted on the upper surface 1702U of a circuit board 1701, while two package units 1201C and 1201D will be mounted on the lower surface 1702L thereof. Each recessed mounting location on the circuit board 1701 has a set of board contact pads 1703 to which the leads 104 of a hidden adjacent IC package 105H of each package unit 1201A-1201D conductively bonded. The leads 104 of the exposed nonadjacent IC package 105E of each package unit 1201A-1201D are coupled to the leads 104 of the hidden package 105H by means of connections which penetrate the carrier 1101. As is the case with the first and second embodiments of the invention, by using a multi-conductive-layer carrier, rerouting of the lead positions may be accomplished. For example, if both packages are identical memory chips requiring individual chip select signals, a chip select signal may be routed to an unused lead of the hidden IC package 105H, then routed within the carrier 1101 to the proper location on the exposed IC package 105E. As all other signals may be shared in common, interconnections between leads of the hidden IC package 105H and identically corresponding leads of the exposed IC package 105E may be made by plated through-holes in the carrier 1101.

Figure 20:
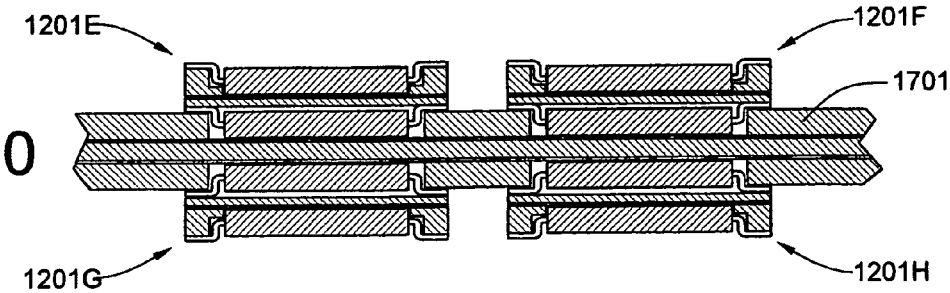
FIG. 20 is a cross-sectional view of the fourth embodiment assembled electronic module of FIG. 18.
Figure 11:
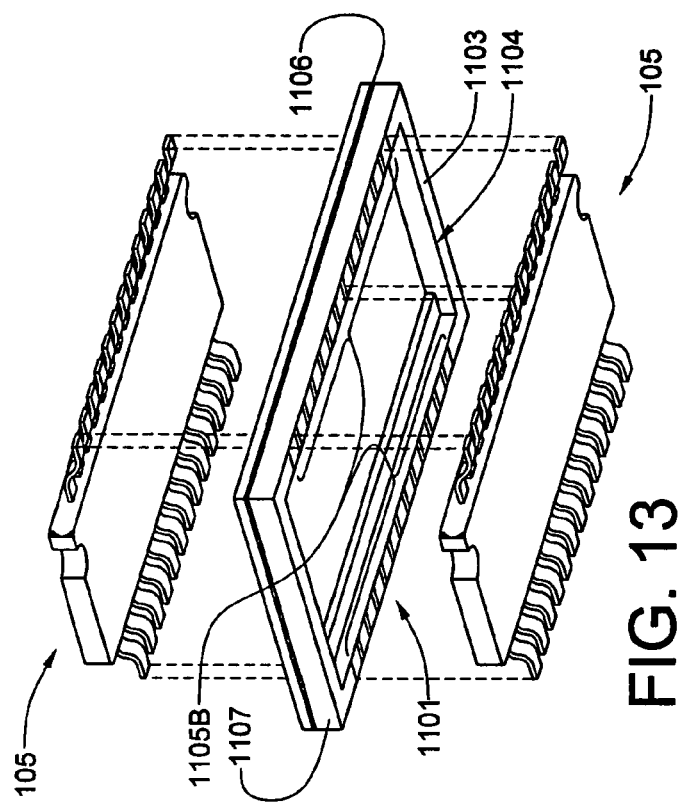
FIG. 11 is an exploded isometric view, from above, of a third embodiment of an IC package unit, which has an IC chip carrier with one major planar surface for mounting one IC chip and a recess on the opposite side thereof for stacked mounting of the IC package pair.
Figure 12:
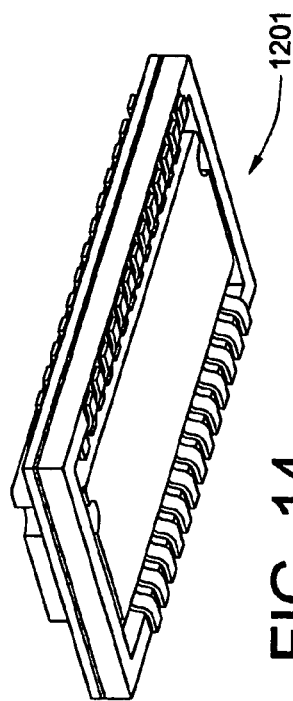
FIG. 12 is an isometric view, from above, of the assembled package unit of FIG. 11.
Figure 13:
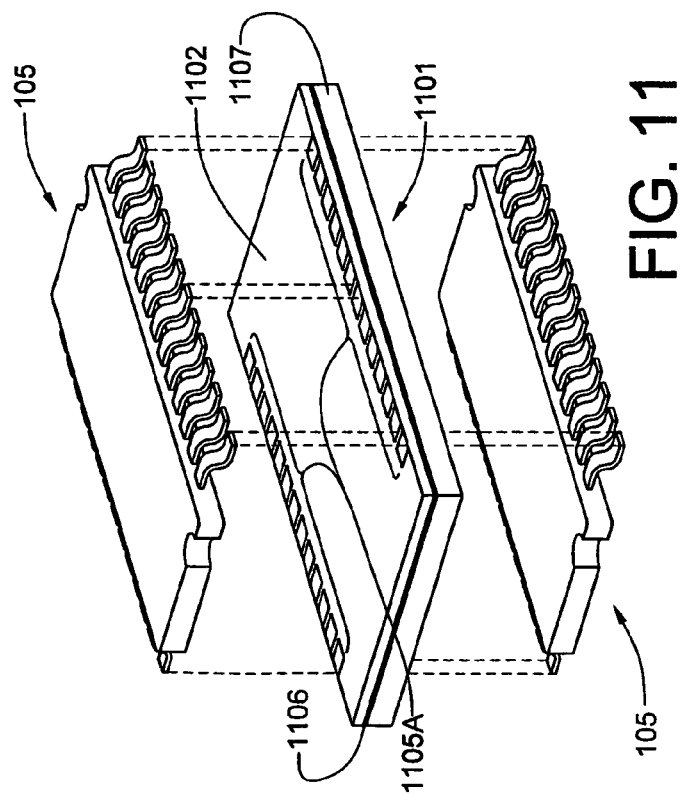
FIG. 13 is an exploded isometric view, from below, of the third embodiment of the IC package unit shown in FIG. 11.
Figure 14:
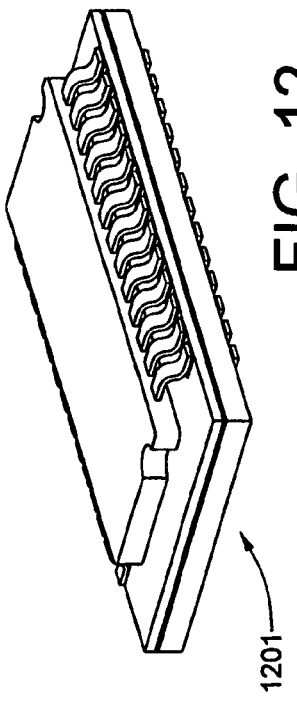
FIG. 14 is an isometric view, from below, of the assembled package unit of FIG. 12.
Figure 18:
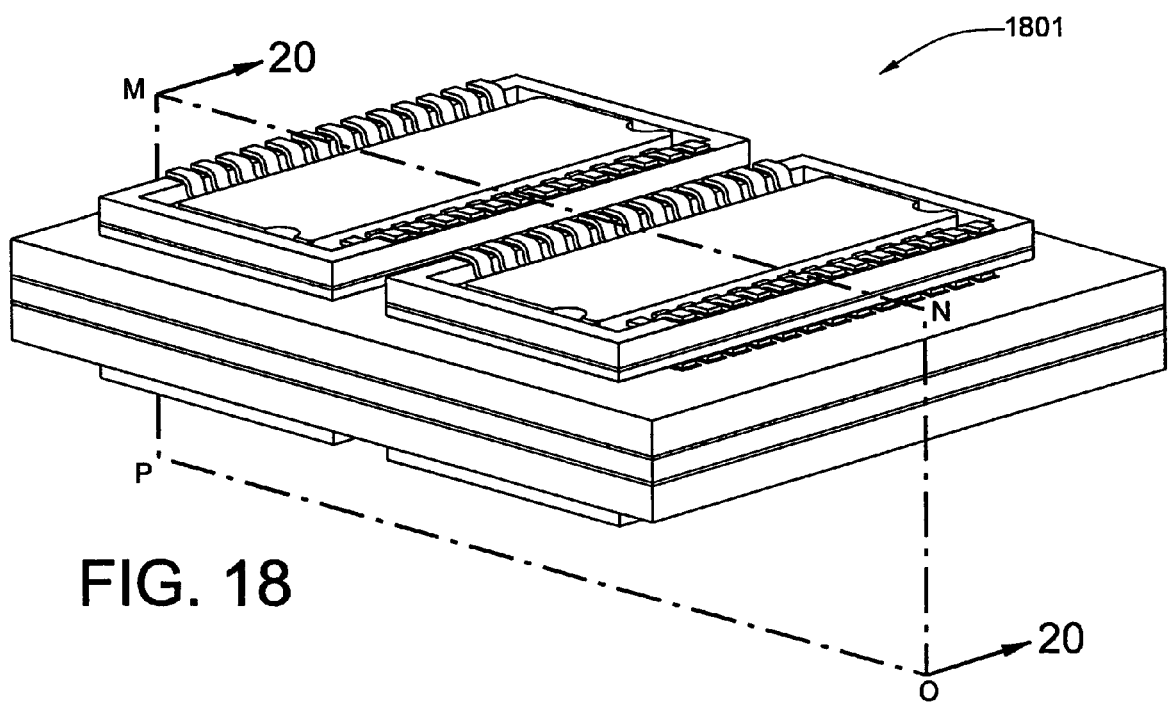
FIG. 18 is an isometric view of the assembled fourth embodiment electronic module of FIG. 17.

Referring now to FIG. 18, surface mounting of the package units 1201 on the circuit board 1701 has resulted in a completed fourth embodiment module 1801. A cross sectional view of the module 1801 through the plane MNOP 1802 provides the view of FIG. 20.

Figure 21:
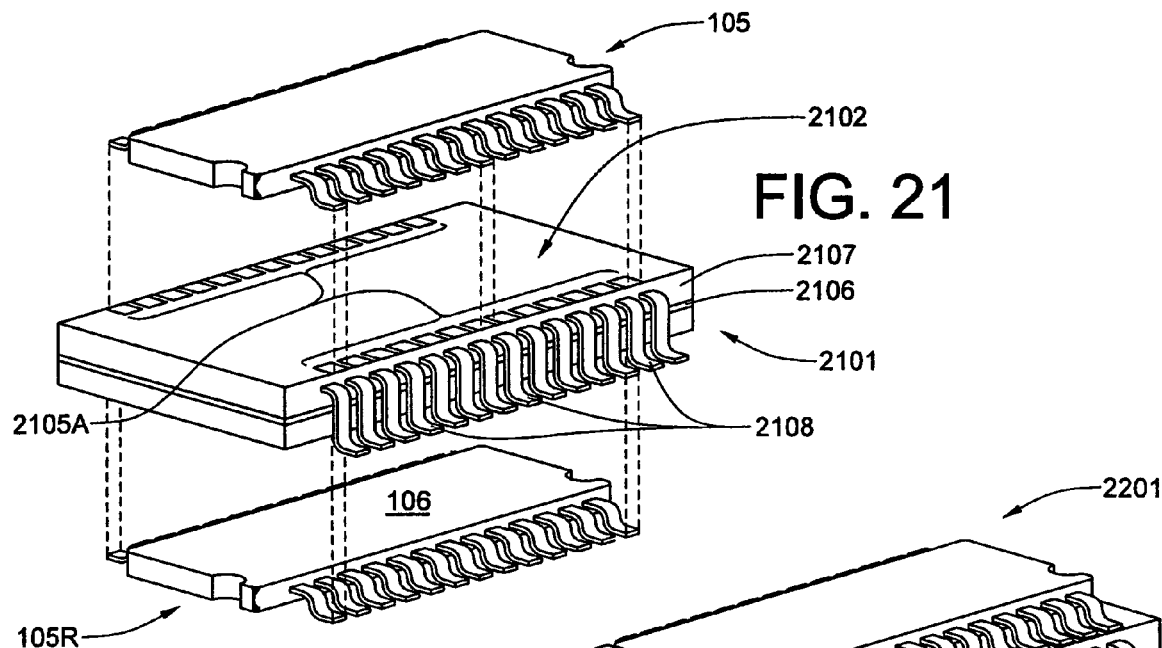
FIG. 21 is an exploded isometric view, from above, of a fourth embodiment IC package unit, which includes a laminar IC chip carrier having its own sets of leads.
Figure 22:
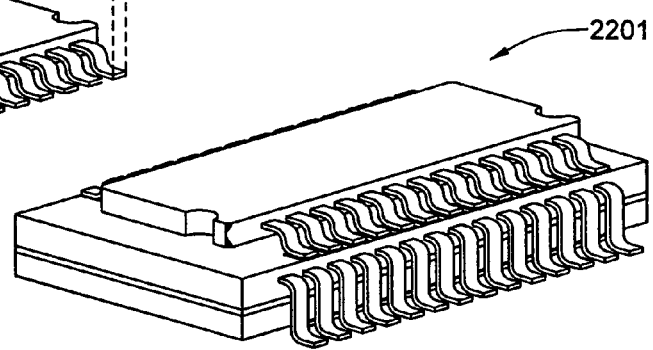
FIG. 22 is an isometric view, from above, of the assembled package unit of FIG. 21.
Figure 23:
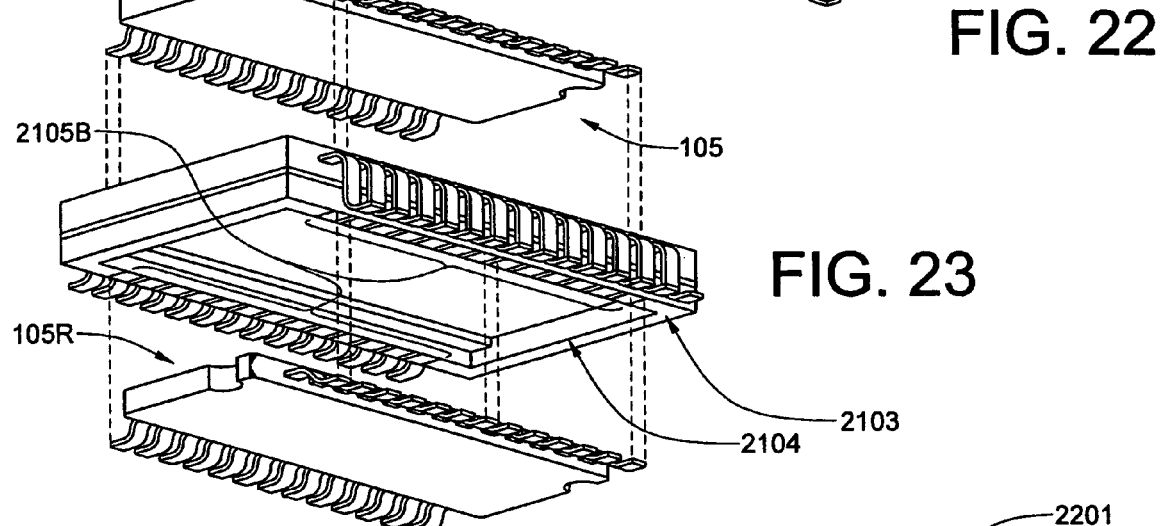
FIG. 23 is an exploded isometric view, from below, of the exploded IC package unit of FIG. 21.
Figure 24:
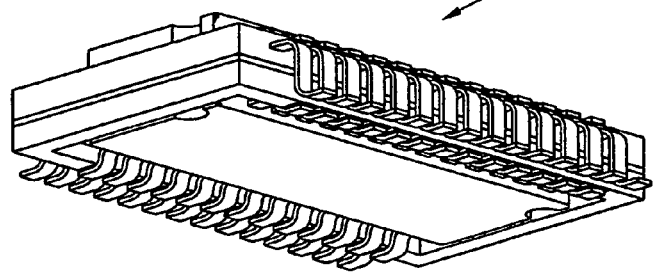
FIG. 24 is an isometric view, from below, of the assembled package unit of FIG. 22.

A fourth embodiment IC package unit, shown in FIGS. 21-24 is used for a fifth embodiment module. Referring now to FIG. 21, the primary difference between the fourth embodiment carrier 2101 and that of the third embodiment carrier 1101 is the addition of carrier leads 2108, which are used to attach the fourth embodiment package unit to a circuit board. The fourth embodiment carrier 2101 also has a planar first major surface 2102 and a second major surface 2103 with a package mounting recess 2104. Both the planar surface 2102 and the recess-equipped second surface 2103 have an electrical contact pad set 2105A and 2105B, respectively, to which the leads 104 of each IC package 105 are to be electrically connected. The body 106 of the recessed IC package 105R may be in contact with a heat sink layer 2106 embedded within the carrier substrate 2107. A conductive paste (not shown) may be employed to enhance heat transfer between the package body and the heat sink layer 2106. The resulting assembly, shown in FIGS. 22 and 24, constitutes the fourth embodiment IC package unit 2201. Each of the IC packages 105 of a package unit is mounted in a stacked relationship, which means that corresponding leads on two identical IC packages lie directly above and below one another. Such a configuration facilitates interconnection of the common pins on both chips, as plated through-hole connectors can be used without rerouting traces within the carrier substrate 2107.

Figure 25:
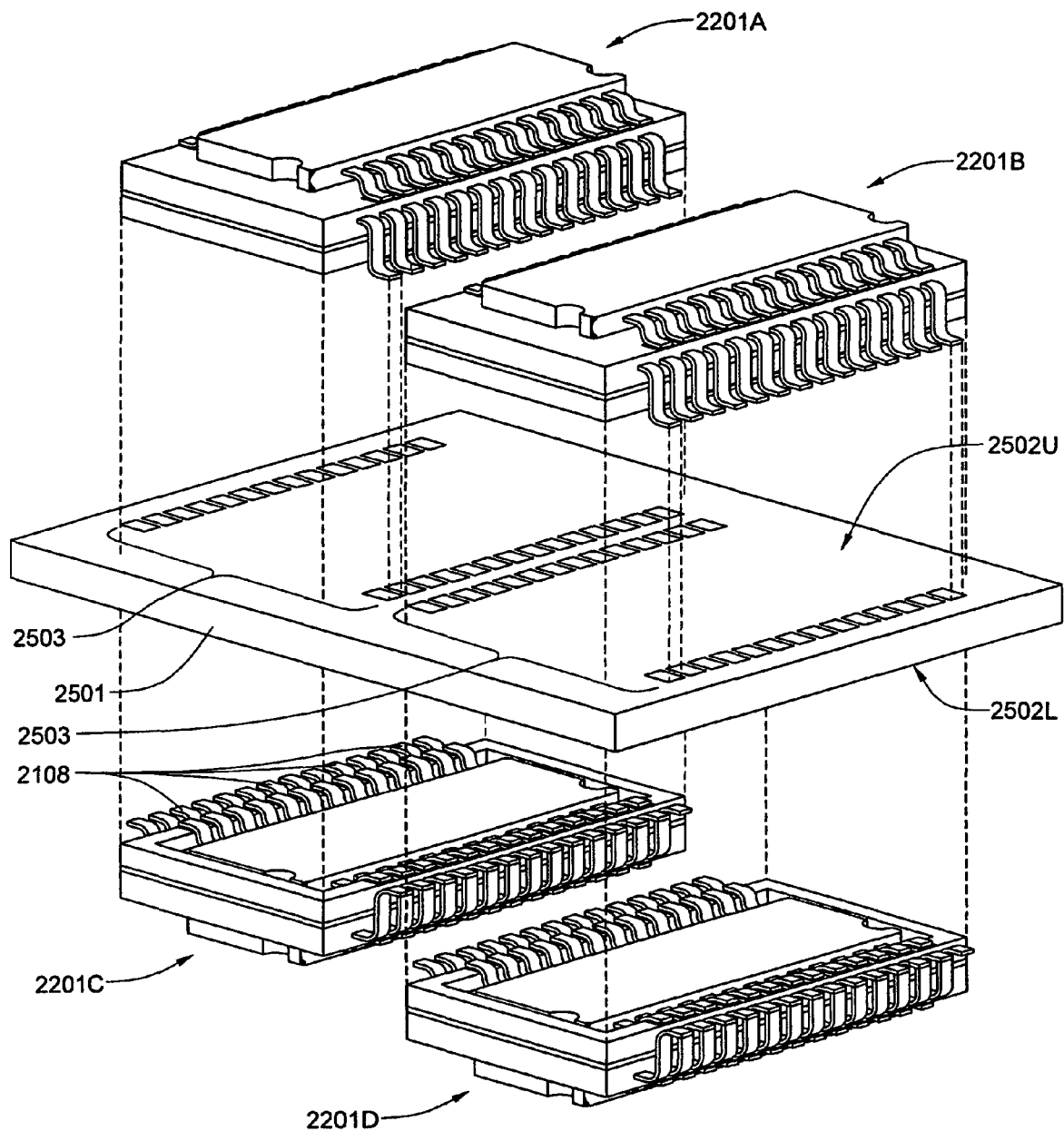
FIG. 25 is an exploded isometric view of a fifth embodiment electronic module incorporating multiple fourth embodiment IC package units.

Referring now to FIG. 25, multiple fourth embodiment package units 2201 (in this example, four) are shown ready for mounting on a circuit board 2501 having two major opposing planar surfaces on which package units may be mounted. In this example, two package units 2201A and 2201B will be mounted on the upper surface 2502U of a circuit board 2501, while two package units 2201C and 2201D will be mounted on the lower surface 2502L thereof. Each package mounting location on the circuit board 2501 has a set of board contact pads 2503 to which the carrier leads 2108 of each package unit 2201 will be conductively bonded.

Figure 26:
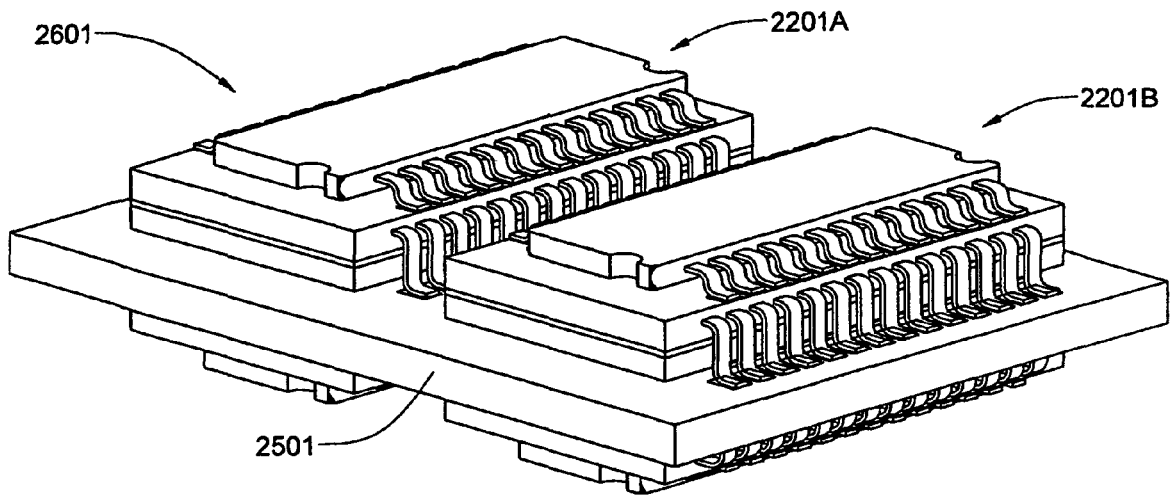
FIG. 26 is an isometric view of the assembled fifth embodiment electronic module of FIG. 25.

Referring now to FIG. 26, surface mounting of the package units 2201 on the circuit board 2501 has resulted in a completed fifth embodiment module 2601.

Figure 27:
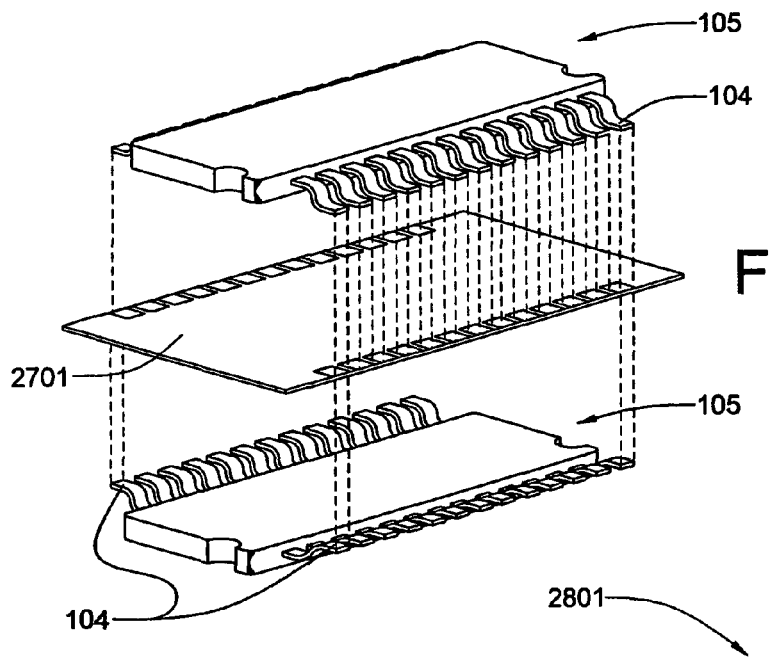
FIG. 27 is an exploded view of a fifth embodiment IC package unit, which is a variant of the first embodiment IC package unit, in which the laminar carrier is replaced with a flexible thin film carrier.
Figure 28:
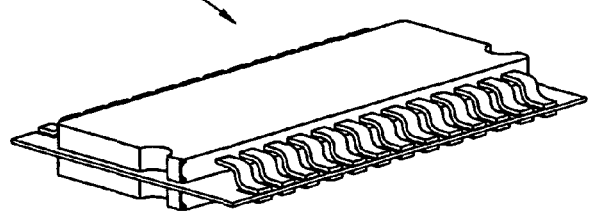
FIG. 28 is a cross-sectional view of an assembled fifth embodiment IC package unit.

Referring now to FIGS. 27 and 28, a fifth embodiment IC package unit is constructed using a thin film carrier substrate 2701. Other than this distinctive feature, the resulting sixth embodiment package unit 2801 is functionally identical to the first embodiment package unit 201.

Figure 29:
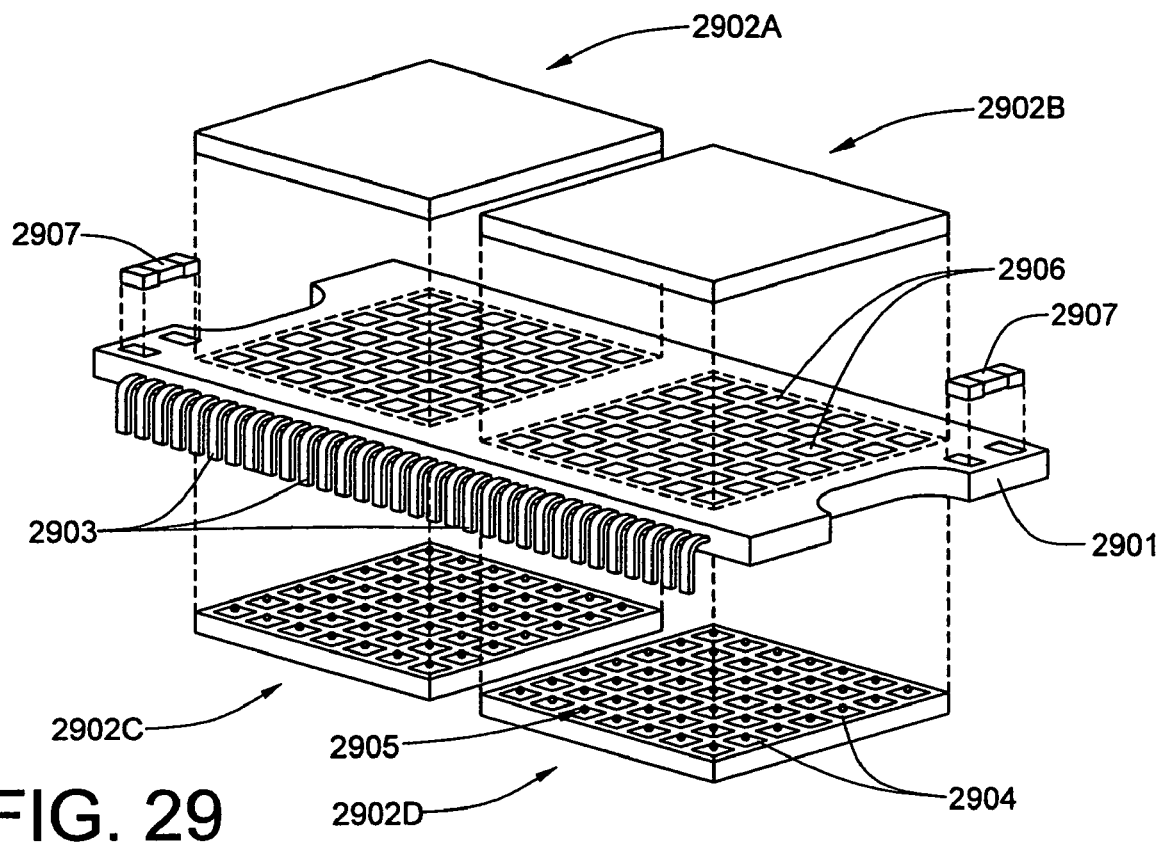
FIG. 29 is an exploded isometric view of a sixth embodiment IC package unit incorporating four ball-grid-array IC packages.
Figure 30:
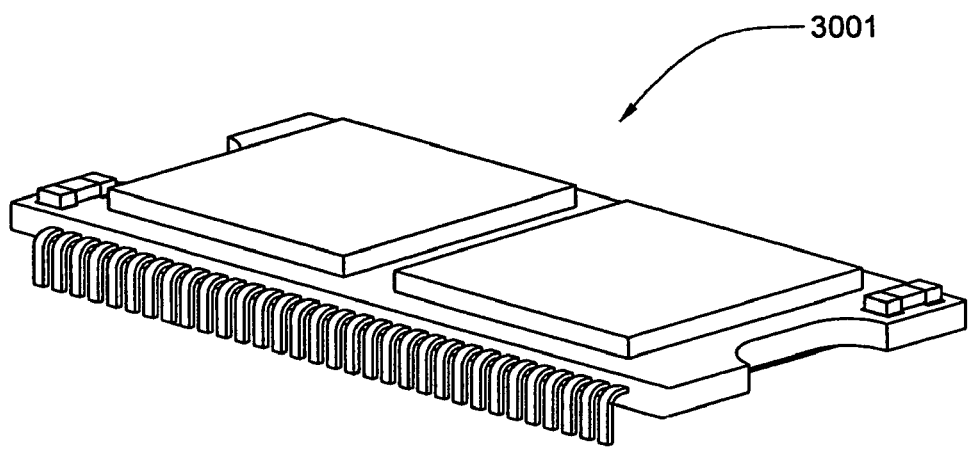
FIG. 30 is an isometric view of the assembled sixth embodiment IC package unit of FIG. 29.

Referring now to FIG. 29, a seventh embodiment electronic module utilizes a sixth embodiment carrier 2901 designed for the mounting of multiple ball-grid array IC packages 2902. Such packages employ pads, rather than leads, to make connection from a semiconductor chip to the external world. This carrier 2901 incorporates butt-I-joint leads 2903, which are solder reflowable for mounting to pads on a printed circuit board. Each of the ball-grid array IC packages 2902 has a plurality of connection elements, which in this case are pads, 2904 on each of which a metal (e.g., gold) ball 2905 has been bonded or solder reflow attached. Referring now to FIG. 30, each of the ball-grid array IC packages 2902 has been mounted on the carrier 2901 and each of the balls 2905 is physically and electrically bonded to a corresponding pad 2906 on the carrier 2901. Bonding can be via solder reflow, via vibrational energy input, or any other known technique. The mounting process has created a multiple-package ball-grid array package unit 3001.

Referring now to FIG. 31, each of the butt-I-joint leads 2903 of carrier 2901 has been solder reflowed to a pad 3101 on printed circuit board 3102, thereby interconnecting the ball-grid array package unit 3001 to the board circuitry (not shown). FIG. 32 shows eight of such package units 3001 mounted on a printed circuit board 3201 of the type known as a DIMM module. DIMM modules are in wide use as SDRAM memory modules for personal computers.

Figure 33:
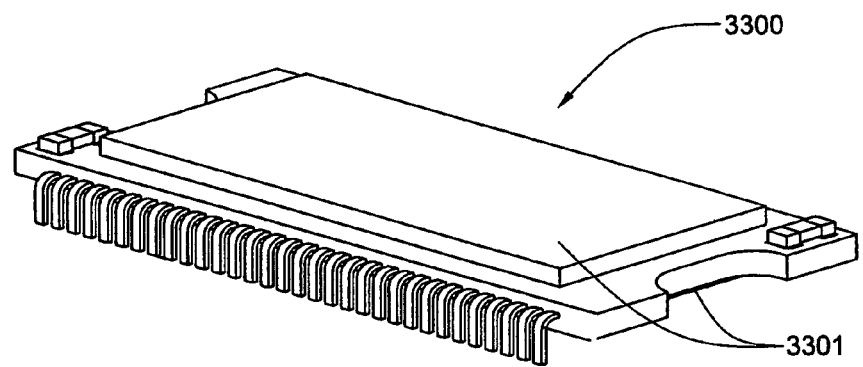
FIG. 33 is an isometric view of a variant of the sixth embodiment IC package unit having but two IC packages thereon.
Figure 34:
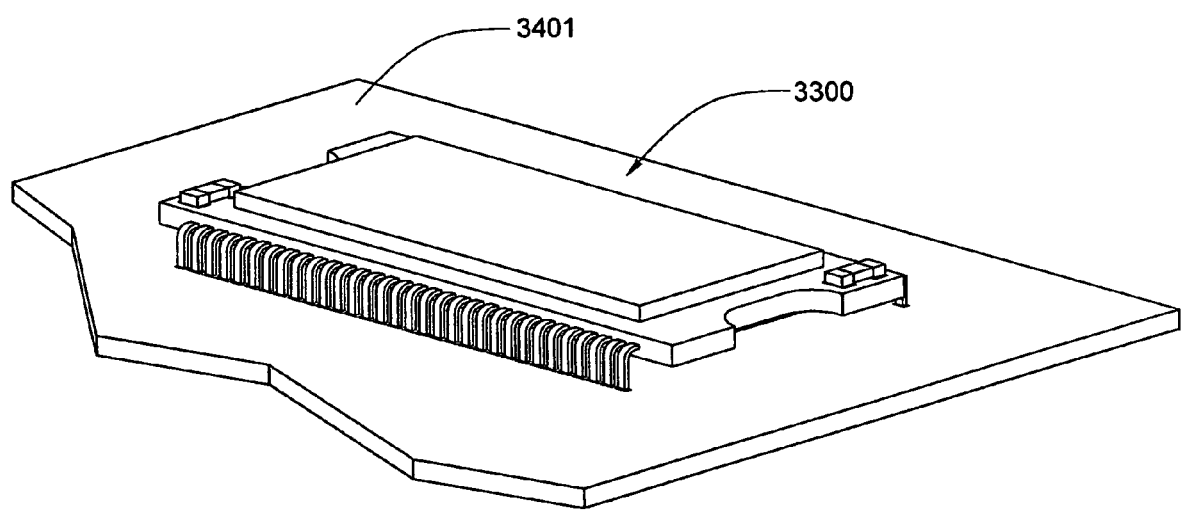
FIG. 34 is an isometric view of the assembled IC package unit of FIG. 33 mounted on a portion of a printed circuit board.

Referring now to FIG. 33, a ball-grid array IC package unit 3300 having only two ball-grid-array packages 3301 thereon is shown. FIG. 34 shows this IC package unit 3300 mounted on a portion of a circuit board 3401.

Figure 35:
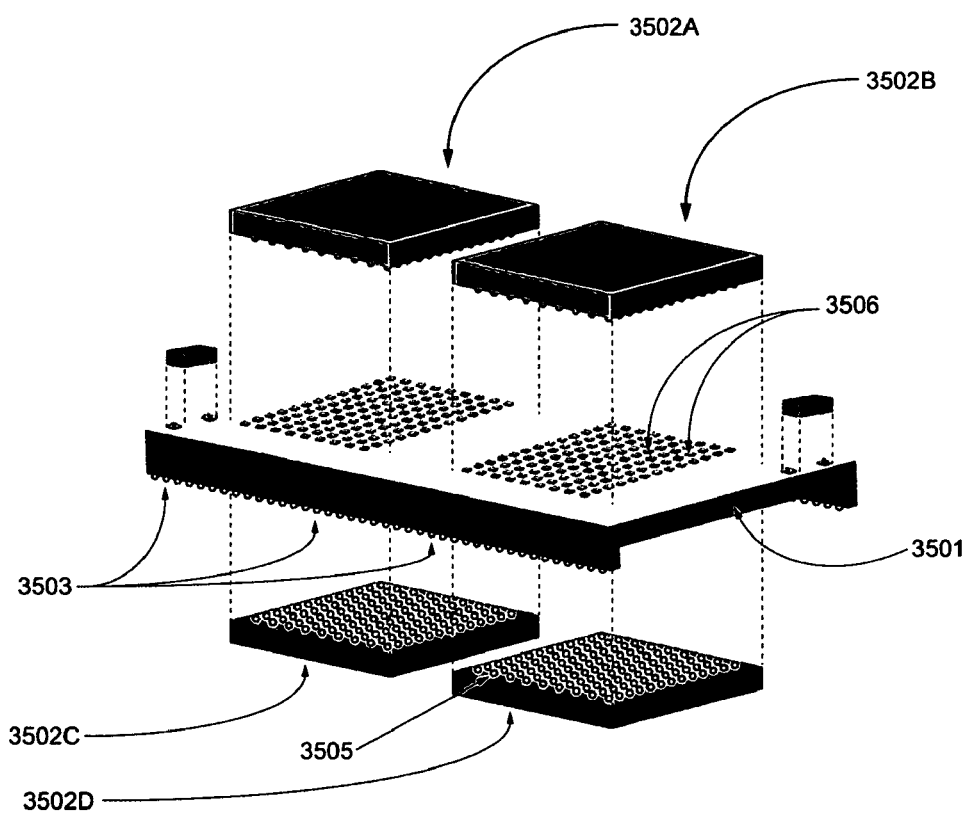
FIG. 35 is an exploded isometric view of another embodiment IC package unit incorporating ball-grid array packages on a carrier with a ball-grid array.
Figure 36:
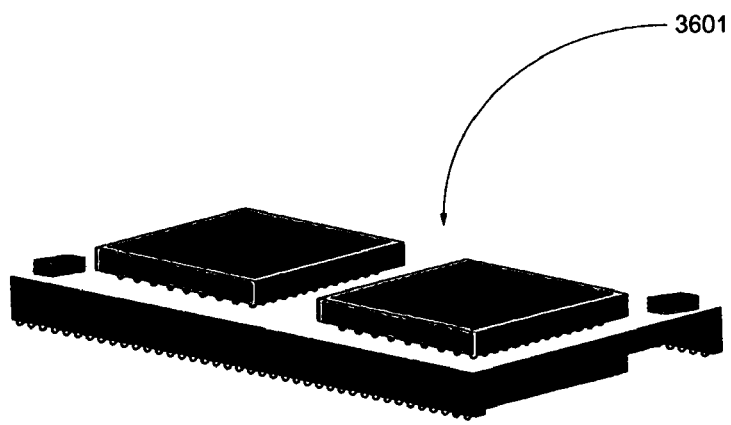
FIG. 36 is an isometric view of the assembled embodiment shown in FIG. 35.

Referring now to FIG. 35, a seventh embodiment electronic module utilizes a sixth embodiment carrier 3501 designed for the mounting of multiple ball-grid array IC packages 3502 A-D. Such packages may employ pads, rather than leads, to make connection from a semiconductor chip to the external world. This carrier 3501 incorporates a ball-grid array 3503, which is solder reflowable for mounting to pads on a printed circuit board. Each of the ball-grid array IC packages 3502 A-D may have a plurality of connection elements, which may, for example include pads on each of which a metal (e.g., gold) ball 3505 may be bonded or solder reflow attached. Each of the ball-grid array IC packages 3502 may be mounted on the carrier 3501 and each of the balls 3505 may be physically and electrically bonded to a corresponding pad on the carrier 3501. Bonding can be via solder reflow, via vibrational energy input, or any other known technique. The mounting process creates a multiple-package ball-grid array package unit 3601, shown in FIG. 36.

Although only several embodiments of the present invention have been disclosed and described herein, it will be obvious to those having ordinary skill in the art of semiconductor assembly technology, that changes and modifications may be made thereto without departing from the scope of the invention as hereinafter claimed. For example, the types of leads shown in for the various IC packages and carriers are those which are in common usage at the time of the filing of the application. Other leads having similar, but more compact, features have been developed and will likely come into common usage.

What is claimed is:

1. An electronic circuit module comprising:
   a carrier, comprising a first integrated circuit mounting location comprising at least one first mounting pad array, and a second integrated circuit mounting location disposed on the opposite side of said first mounting pad array comprising at least one second mounting pad array wherein said first and second mounting pad arrays are conductively coupled with said carrier;
   first and second sets of integrated circuit packages, each set comprising at least one package, and each package having a package body comprising at least one integrated circuit chip and a ball-grid array; wherein said ball-grid array of said at least one first integrated circuit package is directly above said first mounting pad array and said ball-grid array of said second integrated circuit package is directly beneath said second mounting pad array, and wherein said ball-grid array of said first and second sets of integrated circuit packages are conductively bonded to said first and second mounting pad arrays; and
   a printed circuit board having at least one interconnection pad array coupled to circuitry on said printed circuit and conductively bonded to said carrier, said carrier further comprises a carrier body with a recess for receiving at least a portion of said second set of integrated circuit packages.

2. The electronic circuit module of claim 1 wherein individual mounting pads of said at least one first mounting pad array are coupled to individual mounting pads of said at least one second mounting pad array by means of conductive links within said carrier.

3. The electronic circuit module of claim 1 further comprising a flexible polymeric film comprising first and second major planar faces corresponding, respectively, to said first and second integrated circuit mounting locations.

4. The electronic circuit module of claim 1 wherein said carrier further comprises a semi-rigid laminar substrate having first and second major faces corresponding, respectively, to said first and second integrated circuit mounting locations.

5. The electronic circuit module of claim 1 wherein individual mounting pads of said at lease one first mounting pad array and said at least one second mounting pad array are conductively coupled to individual balls of said ball-grid array on said carrier, and wherein said ball-grid array is conductively coupled to said interconnection pad array.

6. The electronic circuit module of claim 3 wherein said first major face is planar, and said second major face comprise a recess, said first sets of integrated circuit packages are mounted on said planar first major face and said second sets of integrated circuit packages are mounted within said recess.

7. The electronic circuit module of claim 1 wherein said ball-grid array on said carrier comprises balls configured in at least single row.

8. The electronic circuit module of claim 1 wherein said ball-grid array on said carrier comprises balls configured in a double row.

9. The electronic circuit module of claim 1 wherein said ball-grid array is selected from the group of Polyimide ball-grid array and ceramic ball-grid array.

10. An electronic circuit module comprising:
a carrier, comprising a first integrated circuit mounting location comprising at least one first mounting pad array, and a second integrated circuit mounting location disposed on the opposite side of said first mounting pad array comprising at least one second mounting pad array wherein said first and second mounting pad arrays are conductively coupled with said carrier; and
first and second sets of integrated circuit packages, each set comprising at least one package, and each package having a package body comprising at least one integrated circuit chip and a ball-grid array, wherein said ball-grid array of said at least one first integrated circuit package is directly above said first mounting pad array and said ball-grid array of said second integrated circuit package is directly beneath said second mounting pad array, and wherein said ball-grid array of said first and second sets of integrated circuit packages are conductively bonded to said first and second mounting arrays; and
said carrier further comprises a carrier body with a recess for receiving at least a portion of said second set of integrated circuit packages.

11. The electronic circuit module of claim 10 further comprising a printed circuit board having at least one interconnection pad array coupled to circuitry on said printed circuit and conductively bonded to said carrier.

12. The electronic circuit module of claim 10 wherein individual mounting pads of said at least one first mounting pad array are coupled to individual mounting pads of said at least one second mounting pad array by means of conductive links within said carrier.

13. The electronic circuit module of claim 10 further comprising a flexible polymeric film comprising first and second major planar faces corresponding, respectively, to said first and second integrated circuit mounting locations.

14. The electronic circuit module of claim 10 wherein said carrier further comprises a semi-rigid laminar substrate having first and second major faces corresponding, respectively, to said first and second integrated circuit mounting locations.

15. The electronic circuit module of claim 10 wherein said carrier further comprises individual mounting pads of said at least one first mounting pad array and said at least one second mounting pad array are conductively coupled to individual balls of said ball-grid array of said carrier, and wherein said ball-grid array is conductively coupled to said interconnection pad array.

16. The electronic circuit module of claim 13 wherein each of said first and second major faces incorporates a recess for receiving a single integrated circuit package.

17. The electronic circuit module of claim 13 wherein said first major face is planar, and said second major face comprise a recess, said first sets of integrated circuit packages are mounted on said planar first major face and said second sets of integrated circuit packages are mounted within said recess.

18. The electronic circuit module of claim 10 further comprising at least a second carrier conductively bonded with said printed circuit board.

19. The electronic circuit module of claim 10 wherein said ball-grid array on said carrier comprises balls configured in at least a single row.

20. The electronic circuit module of claim 10 wherein said ball-grid array on said carrier comprises balls configured in a double row.

21. An electronic module comprising:
a carrier, comprising:
at least one mounting pad array,
a ball-grid array, and
a carrier interface,
wherein said at least one mounting pad array is coupled with said carrier interface and said ball-grid array is conductively coupled with said carrier interface
wherein said carrier further comprises a recess; and
at least one integrated circuit package comprising:
an integrated circuit chip, and
a ball-grid array,
wherein said ball-grid array of said at least one integrated circuit package is directly above said at least one mounting pad array,
wherein said ball-grid array on said at least one integrated circuit package are conductively bonded to said at least one mounting pad arrays, and
wherein said recess of said carrier is adapted to receive the body of a second integrated circuit package.

22. The electronic module of claim 21 wherein said ball-grid array on said carrier comprises balls configured in at least a single row.

23. The electronic module of claim 21 wherein said ball-grid array on said carrier comprises balls configured in a double row.

24. The electronic module of claim 21 further comprising a printed circuit board comprising at least one interconnection pad array coupled to circuitry on said printed circuit and conductively bonded to said carrier.

25. The electronic module of claim 21 wherein said ball-grid array is selected from the group of Polyimide ball-grid array and ceramic ball-grid array.

26. The electronic module of claim 21 wherein individual mounting pads of said mounting pad array are coupled with said carrier interface with individual balls of said ball-grid array by means of conductive links within said carrier.

27. The electronic module of claim 21 further comprising a second carrier, comprising:
a second mounting pad array,
a second ball-grid array, and
a second carrier interface,
wherein said second mounting pad array is coupled with said second carrier interface and said second ball-grid array is conductively coupled with said second carrier interface;
a second integrated circuit package comprising:
a second integrated circuit chip, and
a second ball-grid array,
wherein said second ball-grid array on said second integrated circuit package are conductively bonded to said second mounting pad arrays; and
a printed circuit board having at least one interconnection pad array coupled to circuitry on said printed circuit and conductively bonded to said second carrier interface and said carrier interface.

28. The electronic module of claim 27 wherein second carrier further comprises a carrier body with a recess within said second carrier.

29. The electronic module of claim 21 further comprising:
a second integrated circuit package comprising:
   a second integrated circuit chip, and
   a second ball-grid array;
wherein said interconnection pad array on said printed circuit board comprises interconnection pads beneath the recess in said carrier and said second ball-grid array on said second integrated circuit package are conductively bonded to said interconnection array beneath the recess in said carrier on said printed circuit board.

* * * * *